US011769735B2

(12) United States Patent
Pietambaram et al.

(10) Patent No.: US 11,769,735 B2
(45) Date of Patent: Sep. 26, 2023

(54) CHIPLET FIRST ARCHITECTURE FOR DIE TILING APPLICATIONS

(71) Applicant: Intel Corporation, Santa Clara, CA (US)

(72) Inventors: Srinivas Pietambaram, Chandler, AZ (US); Gang Duan, Chandler, AZ (US); Deepak Kulkarni, Chandler, AZ (US); Rahul Manepalli, Chandler, AZ (US); Xiaoying Guo, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 821 days.

(21) Appl. No.: 16/274,086

(22) Filed: Feb. 12, 2019

(65) Prior Publication Data

US 2020/0258847 A1    Aug. 13, 2020

(51) Int. Cl.
*H01L 21/56* (2006.01)
*H01L 23/00* (2006.01)
(Continued)

(52) U.S. Cl.
CPC ........ *H01L 23/562* (2013.01); *H01L 21/4853* (2013.01); *H01L 21/4857* (2013.01);
(Continued)

(58) Field of Classification Search
CPC ............... H01L 23/562; H01L 21/4853; H01L 21/4857; H01L 21/565; H01L 21/568; H01L 23/3121; H01L 23/5383; H01L 23/5386; H01L 23/5389; H01L 24/19; H01L 24/20; H01L 2224/214;
(Continued)

(56) References Cited

U.S. PATENT DOCUMENTS 8,901,748 B2    12/2014  Manusharow
9,190,380 B2 *  11/2015  Teh .................. H01L 23/50
(Continued)

FOREIGN PATENT DOCUMENTS

TW        202021073        6/2020
WO    WO 2018/009145       1/2018
(Continued)

OTHER PUBLICATIONS

Search Report for European Patent Application No. 20174455.4, dated Oct. 22, 2020, 9 pgs.
(Continued)

*Primary Examiner* — Vu A Vu
(74) *Attorney, Agent, or Firm* — Schwabe, Williamson & Wyatt. P.C.

(57) ABSTRACT

Embodiments disclosed herein include electronic packages and methods of forming such electronic packages. In an embodiment, the electronic package comprises a mold layer having a first surface and a second surface opposite the first surface, and a plurality of first dies embedded in the mold layer. In an embodiment, each of the plurality of first dies has a surface that is substantially coplanar with the first surface of the mold layer. In an embodiment, the electronic package further comprises a second die embedded in the mold layer. In an embodiment, the second die is positioned between the plurality of first dies and the second surface of the mold layer.

25 Claims, 17 Drawing Sheets

(51) Int. Cl.
  *H01L 21/48* (2006.01)
  *H01L 23/31* (2006.01)
  *H01L 23/538* (2006.01)

(52) U.S. Cl.
  CPC .......... *H01L 21/565* (2013.01); *H01L 21/568* (2013.01); *H01L 23/3121* (2013.01); *H01L 23/5383* (2013.01); *H01L 23/5386* (2013.01); *H01L 23/5389* (2013.01); *H01L 24/19* (2013.01); *H01L 24/20* (2013.01); *H01L 2224/214* (2013.01); *H01L 2924/3511* (2013.01)

(58) Field of Classification Search
  CPC ......... H01L 2924/3511; H01L 25/0652; H01L 25/50; H01L 23/5385; H01L 24/16; H01L 24/96; H01L 25/03; H01L 2224/04105; H01L 2224/12105; H01L 2224/16145; H01L 2224/16227; H01L 2224/16235; H01L 2224/17181; H01L 2224/32145; H01L 2224/32225; H01L 2224/73204; H01L 2224/73259; H01L 2224/81005; H01L 2224/83005; H01L 2224/92125; H01L 2224/92224; H01L 2225/06513; H01L 2225/06517; H01L 2225/06524; H01L 2924/15311; H01L 2924/18161; H01L 2924/18162; H01L 2224/18; H01L 25/18; H01L 23/3107; H01L 23/31; H01L 23/481; H01L 23/528; H01L 25/0657
  USPC ......................................................... 257/668
  See application file for complete search history.

(56) References Cited

U.S. PATENT DOCUMENTS

| | | | |
|---|---|---|---|
| 9,275,955 B2* | 3/2016 | Mahajan | H01L 25/165 |
| 9,418,924 B2* | 8/2016 | Woychik | H01L 25/0657 |
| 9,595,496 B2* | 3/2017 | Lee | H01L 23/5384 |
| 9,627,365 B1* | 4/2017 | Yu | H01L 23/28 |
| 9,666,559 B2* | 5/2017 | Wang | H01L 25/0655 |
| 9,831,170 B2* | 11/2017 | Scanlan | H01L 24/96 |
| 10,008,439 B2* | 6/2018 | Zhao | H01L 21/4857 |
| 10,217,720 B2* | 2/2019 | Wang | H01L 23/3135 |
| 10,312,220 B2* | 6/2019 | Hiner | H01L 24/17 |
| 10,453,802 B2 | 10/2019 | Hu | |
| 10,504,847 B2* | 12/2019 | Chang | H01L 21/568 |
| 10,510,721 B2 | 12/2019 | Bhagavat | |
| 10,593,628 B2 | 3/2020 | Bhagavat | |
| 10,651,126 B2* | 5/2020 | Hsiung | H01L 23/5384 |
| 10,720,401 B2* | 7/2020 | Ting | H01L 24/20 |
| 10,867,954 B2* | 12/2020 | Ting | H01L 23/5385 |
| 11,088,124 B2 | 8/2021 | Chen | |
| 11,289,424 B2 | 3/2022 | Wu | |
| 2014/0159228 A1 | 6/2014 | Teh | |
| 2016/0071818 A1 | 3/2016 | Wang et al. | |
| 2017/0125379 A1* | 5/2017 | Chen | H01L 21/4853 |
| 2019/0043792 A1 | 2/2019 | Weerasekera | |
| 2020/0006232 A1 | 1/2020 | Pietambaram | |

FOREIGN PATENT DOCUMENTS

| | | |
|---|---|---|
| WO | WO 2018/125132 | 7/2018 |
| WO | WO 2019/199428 | 10/2019 |
| WO | WO 2020/005392 | 1/2020 |

OTHER PUBLICATIONS

Office Action from European Patent Application No. 20174455.4, dated Jan. 14, 2022, 5 pgs.
Office Action from European Patent Application No. 20174455.4, dated Sep. 30, 2022, 9 pgs.
Search Report from European Patent Application No. 20156400.2, dated Jun. 18, 2020, 11 pgs.
Search Report from European Patent Application No. 21198092.5, dated Feb. 1, 2022, 10 pgs.
Office Action for U.S. Appl. No. 17/556,667 dated Nov. 30, 2022, 28 pgs.
Office Action for U.S. Appl. No. 17/716,947 dated Dec. 23, 2022, 23 pgs.
Final Office Action for U.S. Appl. No. 17/556,667 dated Apr. 5, 2023, 25 pgs.
Final Office Action for U.S. Appl. No. 17/716,947 dated Apr. 5, 2023, 26 pgs.
Office Action for Taiwan Patent Application No. 109100796 dated Jan. 10, 2023, 33 pgs., with English translation.
Office Action for Taiwan Patent Application No. 110130795 dated Jan. 10, 2023, 22 pgs., with English translation.
Office Action for Taiwan Patent Application No. 111118269 dated Jan. 10, 2023, 15 pgs., with English translation.
Extended European Search Report for European Patent Application No. 22170377.0, dated Aug. 23, 2022, 14 pgs.

* cited by examiner

CHIPLET FIRST ARCHITECTURE FOR DIE TILING APPLICATIONS

TECHNICAL FIELD

Embodiments of the present disclosure relate to electronic packaging, and more particularly, to multi-die electronic packages with first dies and a second die over the first dies and methods of forming such electronic packages.

BACKGROUND

The demand for miniaturization of form factor and increased levels of integration for high performance are driving sophisticated packaging approaches in the semiconductor industry. Die partitioning enabled by embedded multi-die interconnect bridge (EMIB) architectures allows for miniaturization of small form factor and high performance without yield issues seen with other methods. However, such packaging architectures require fine die-to-die interconnects that are susceptible to yield issues due to poor bump thickness variation (BTV) (e.g., due to warpage, limitations on assembly tools, and the like).

Alternative approaches using a patch containing a coarse node die between the fine dies and traditional organic substrates have been proposed as well. Such architectures allow for the integration of dies that are formed at different process nodes. This architecture also has several limitations as well. Particularly, the advanced node dies are attached to the lower node die at later stages of the package formation using thermal compression bonding (TCB). Accordingly, die placement accuracy is limited by the TCB toolset and by warpage. The TCB attach in later stages imposes stringent warpage limitations on the patch and drives a significantly lower TCB window. Furthermore, architecture proposed also relies on a second carrier attach after the advanced node dies are attached in order to implement mid-level interconnect (MLI) and Package Side Bumps (PSB). This leads to additional yield losses.

EMBODIMENTS OF THE PRESENT DISCLOSURE

Described herein are multi-die electronic packages with first dies and a second die over the first dies and methods of forming such electronic packages, in accordance with various embodiments. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

As noted above, multi-die packages provide the ability to continue scaling to smaller form factors while also obtaining advanced performance. However, current architectures suffer from assembly issues that negatively impact yield. Accordingly, embodiments disclosed herein include multi-die packages that are assembled with a process flow that minimizes warpage and alignment issues.

Particularly, embodiments disclosed herein include a plurality of first dies that are at an advanced process node and one or more second dies at a lower process node. In an embodiment, the first dies are placed into the package at the initial stages of package assembly. The early placing of the first dies has several advantages. For one, the placement process may be implemented with a die mounter instead of a thermal compression bonding (TCB) tool. Die mounters have a placement accuracy that is an order of magnitude accurate than a TCB tool. Additionally, there is less warpage during early stage placement of the first dies.

In an embodiment, the attachment of the lower node second die to the first dies also has a larger TCB window. The TCB window is improved since the package is still attached to the first dies on a dimensionally stable (e.g., glass) carrier in place which results in low warpage. Additionally, embodiments allow for mid-level interconnects (MLI) and PSB formation before the carrier is removed. Accordingly, additional carriers otherwise needed for the formation of such features is avoided.

Figure 1A:
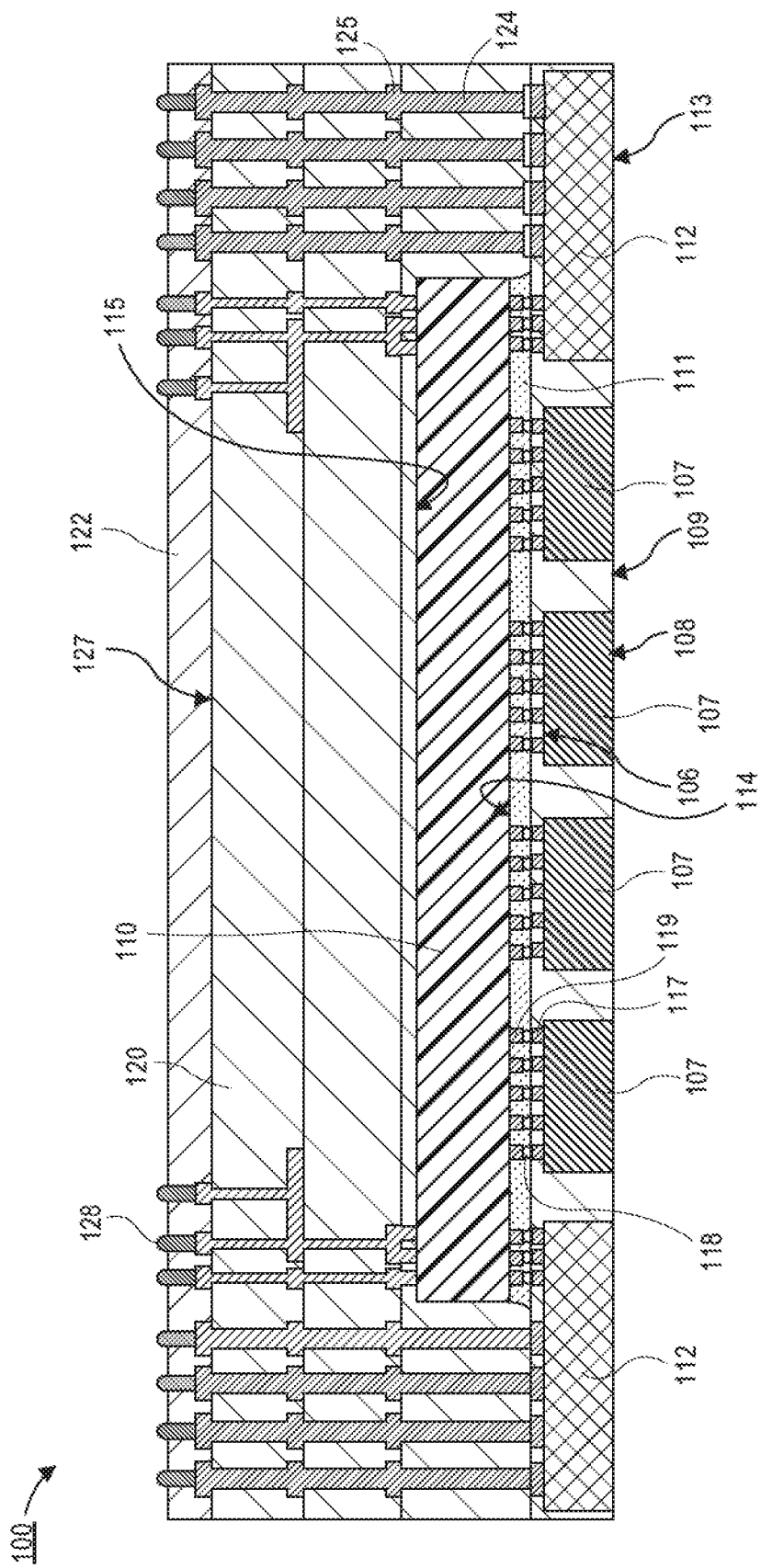
FIG. 1A is a cross-sectional illustration of a multi-die package that includes a plurality of first dies coupled to a second die in a face-to-face configuration, in accordance with an embodiment.

Referring now to FIG. 1A, a cross-sectional illustration of a multi-die electronic package 100 is shown, in accordance with an embodiment. In an embodiment, the electronic package 100 may comprise a mold layer 120 with a plurality of dies embedded in the mold layer. For example, a plurality of first dies 107 and a second die 110 may be embedded in the mold layer 120. While the mold layer 120 is shown as being comprised of discrete layers, it is to be appreciated that no discernable boundary may be present between the different portions of the mold layer 120. In an embodiment, the mold layer 120 may comprise a first surface 109 and a second surface 127 opposite from the first surface 109. The mold layer 120 may comprise any suitable material for electronic packaging, such as epoxy or the like.

In an embodiment, a plurality of first dies 107 may be embedded in the mold layer 120 such that a surface 108 of the first dies 107 is substantially coplanar with the first surface 109 of the mold layer 120. In an embodiment, the surface 108 may be referred to as a backside surface of the first dies 107. Since the backside surface 108 is exposed, thermal management of the electronic package 100 is improved. In some embodiments, a heat sink or other thermal solution may be attached to the backside surface 108 of the first dies 107.

In an embodiment, a plurality of high speed input/out HSIO dies 112 may also be embedded in the mold layer 120. The HSIO dies 112 may be substantially coplanar with the first dies 107. That is, a backside surface 113 of the HSIO dies 112 may be substantially coplanar with the first surface 109 of the mold layer 120 and the backside surface 108 of the first dies 107.

In an embodiment, the plurality of first dies 107 may be electrically coupled to a second die 110 that is embedded in the mold layer 120. In an embodiment, the second die 110 is positioned between an active surface 106 of the first dies 107 and the second surface 127 of the mold layer 120. The second die 110 may have an active surface 114 and a backside surface 115. In an embodiment, the second die 110 and the first dies 107 are arranged in a face-to-face configuration. That is, the active surface 114 of the second die 110 faces the active surfaces 106 of the first dies 107. In an embodiment, the first dies 107 may be fabricated at a first process node and the second die 110 may be fabricated at a second process node that is less advanced than the first process node.

In an embodiment, the first dies 107 may be electrically coupled to the second die 110 with first level interconnects (FLIs) 118. For example, pads 117 of the first dies 107 may be electrically coupled to pads 119 of the second die 110 by FLIs 118, such as controlled collapse chip connection (C4) bumps, or the like. In an embodiment, the pads 119 of the second die 110 and the FLIs 118 may be surrounded by an underfill material 111, and the pads 117 of the first die 107 may be surrounded by the mold layer 120.

In a particular embodiment, the first dies 107 may be interconnected to each other through the second die 110. That is, the second die 110 may function as a patch to provide interconnections between each of the first dies 107. In some embodiments, the first dies 107 may all be substantially similar to each other. In other embodiments, the first dies 107 may comprise different functionalities. In the illustrated embodiment, four first dies 107 are shown. However, it is to be appreciated that an array of any number of first dies 107 (e.g., two or more) may be used in an electronic package 100.

In an embodiment, the HSIO dies 112 may also be electrically coupled to the second die 110. For example, the HSIO dies 112 may be electrically coupled to pads 119 on the second die 110 by FLIs 118 in substantially the same manner the first dies 107 are connected to the second die 110. In an embodiment, the second die 110 may provide interconnections between the first dies 107 and the HSIO dies 112.

In an embodiment, a plurality of redistribution layers (RDLs) comprising conductive traces, pads 125, and vias 124 may be embedded in the mold layer 120. The RDLs may electrically couple surfaces of the first dies 107, the second die 110, and the HSIO dies 112 to mid-level interconnects (MLIs) 128 over the second surface 127 of the mold layer 120. In an embodiment, the MLIs 128 may be positioned in openings through a solder resist 122, as is known in the art.

Figure 1B:
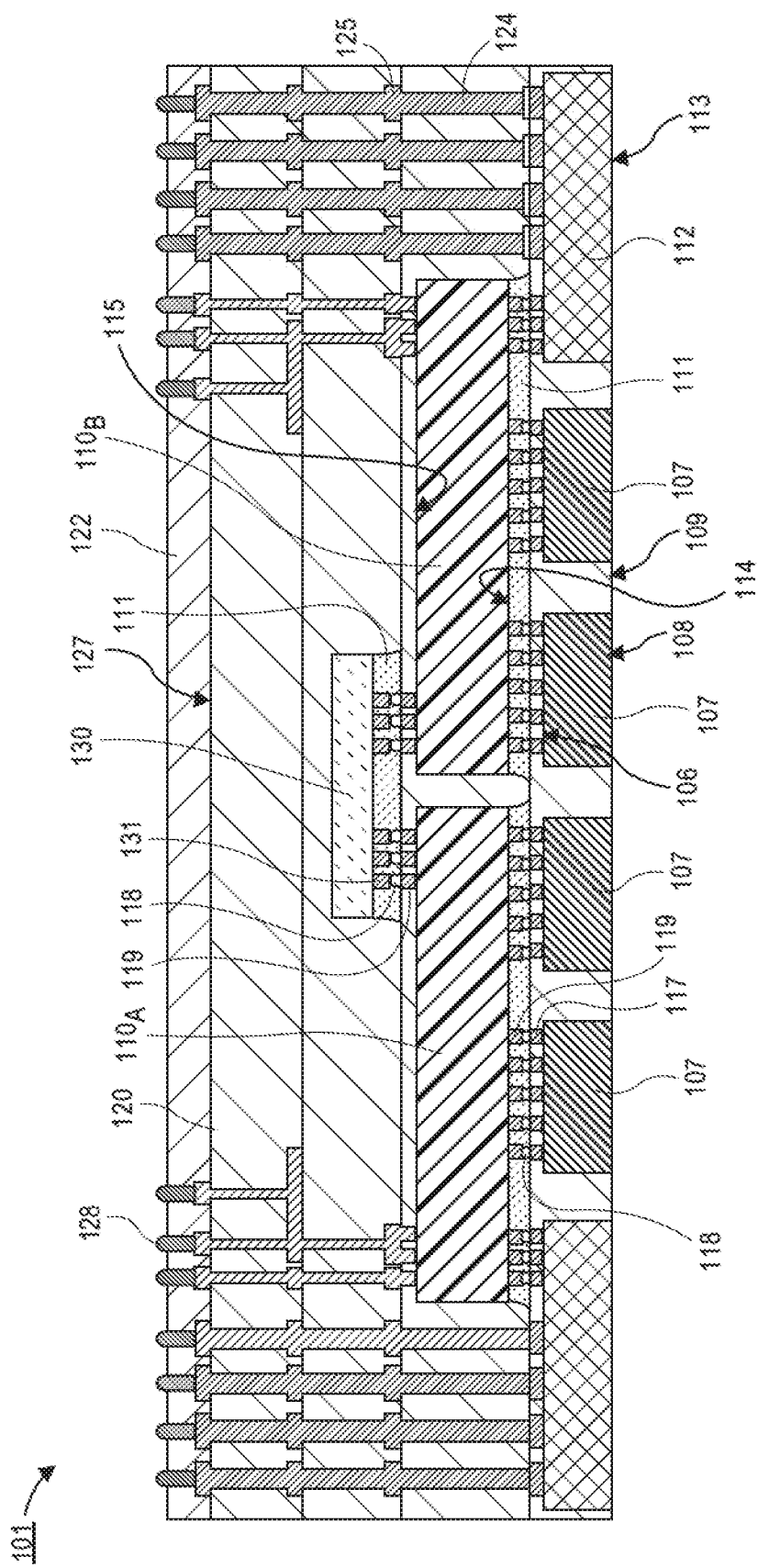
FIG. 1B is a cross-sectional illustration of a multi-die package that includes a plurality of first dies coupled to a plurality of second dies in a face-to-face configuration, where the second dies are coupled together by an embedded bridge, in accordance with an embodiment.

Referring now to FIG. 1B, a cross-sectional illustration of an electronic package 101 is shown, in accordance with an additional embodiment. In an embodiment, the electronic package 101 may be substantially similar to the electronic package 100 described above with respect to FIG. 1A, with the exception that a plurality of second dies 110 are included. In the illustrated embodiment, two second dies 110A and 110E are shown. However, it is to be appreciated that an array of any number of second dies 110 (e.g., two or more) may be included in electronic package 101.

In an embodiment, the second dies 110 may be electrically coupled together with one or more bridges 130. The bridge 130 may be an embedded multi-die interconnect bridge (EMIB) or the like. For example, the bridge 130 may include pads 131 with fine pitch that is suitable for connecting to pads 119 on the backside surface 115 of the second dies 110. For example, FLIs 118 may electrically couple pads 131 to pads 119. In an embodiment, the pads 131 and FLIs 118 may be surrounded by an underfill material 111, and the pads 119 on the backside surface 115 of the second dies 110 may be surrounded by the mold layer 120.

The interconnection of an array of second dies 110 with one or more bridges 130 provides a die tiling architecture. That is, the plurality of second dies 110 may function as a single die. This may be particularly beneficial when the combined area of the second dies exceeds the reticle limit of the process node used to fabricate the second dies 110.

Figure 2A:
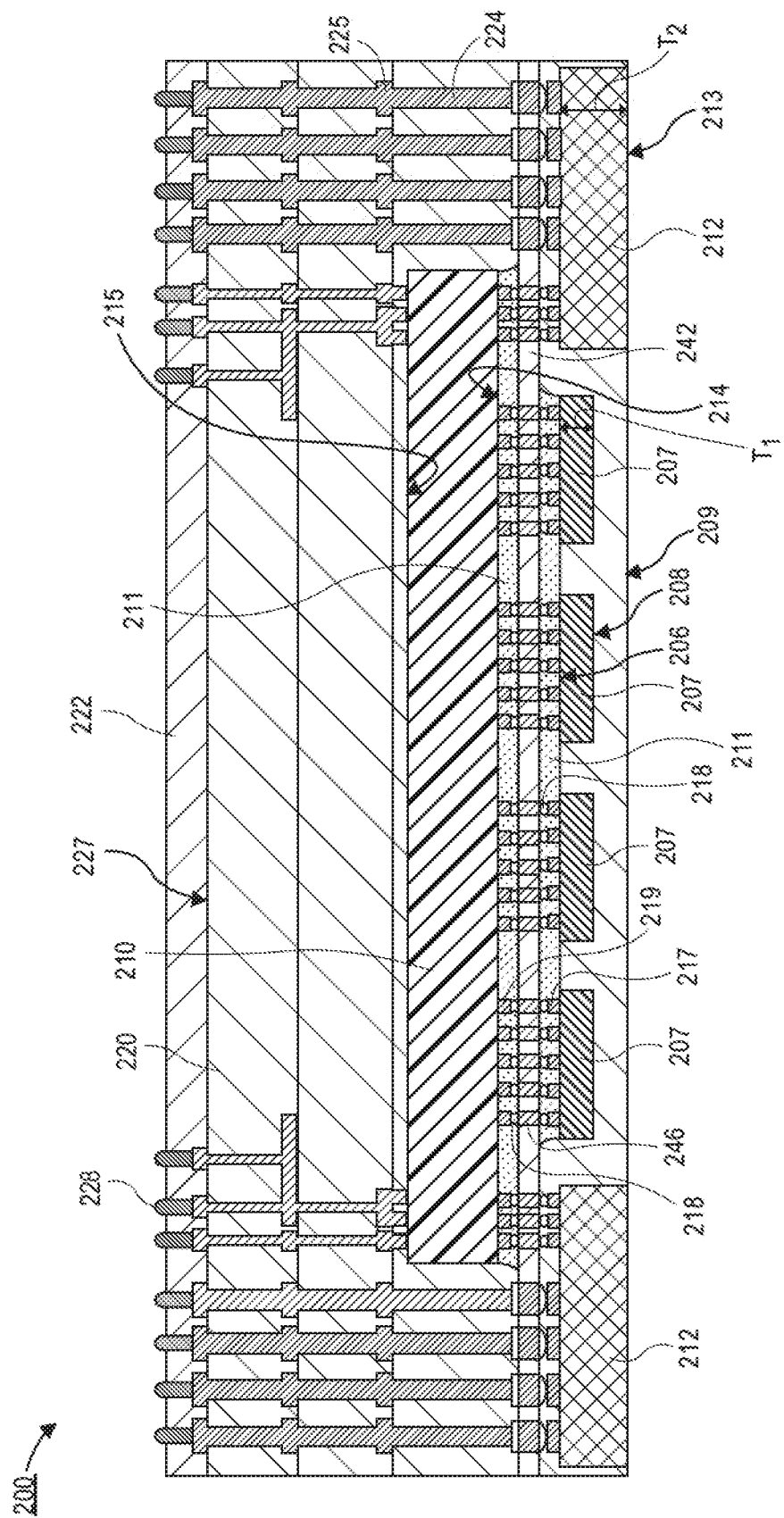
FIG. 2A is a cross-sectional illustration of a multi-die package that includes a plurality of first dies coupled to a second die with a solder resist layer between the first dies and the second die, in accordance with an embodiment.

Referring now to FIG. 2A, a cross-sectional illustration of an electronic package 200 is shown, in accordance with an embodiment. In an embodiment, the electronic package 200 may comprise a mold layer 220 with a plurality of dies embedded in the mold layer. For example, a plurality of first dies 207 and a second die 210 may be embedded in the mold layer 220. While the mold layer 220 is shown as being comprised of discrete layers, it is to be appreciated that no discernable boundary may be present between the different portions of the mold layer 220. In an embodiment, the mold layer 220 may comprise a first surface 209 and a second surface 227 opposite from the first surface 209. The mold layer 220 may comprise any suitable material for electronic packaging, such as epoxy or the like.

In an embodiment, a plurality of first dies 207 may be embedded in the mold layer 220. In contrast to the electronic package 100 described above, a surface 208 of the first dies 207 may be covered by the mold layer 220. In an embodiment, the surface 208 may be referred to as a backside surface of the first dies 207.

In an embodiment, a plurality of HSIO dies 212 may also be embedded in the mold layer 220. The HSIO dies 212 may be substantially coplanar with the first surface 209 of the mold layer 220. That is, a backside surface 213 of the HSIO dies 212 may be substantially coplanar with the first surface 209 of the mold layer 220. In an embodiment, a thickness $T_1$ of the first dies 207 may be different than a thickness $T_2$ of the HSIO dies 212. For example, the thickness $T_1$ of the first dies 207 may be less than the thickness $T_2$ of the HSIO dies 212. As shown in FIG. 2A, the backside surfaces 213 of HSIO dies 212 are substantially coplanar with the surface 209 of mold layer 220. However, it is to be appreciated that the mold layer 220 may also completely embed the HSIO dies 212 so that backside surface 213 is covered by the mold layer 220.

In an embodiment, the plurality of first dies 207 may be electrically coupled to a second die 210 that is embedded in the mold layer 220. In an embodiment, the second die 210 is positioned between an active surface 206 of the first dies 207 and the second surface 227 of the mold layer 220. The second die 210 may have an active surface 214 and a backside surface 215. In an embodiment, the second die 210 and the first dies 207 are arranged in a face-to-face configuration. That is, the active surface 214 of the second die 210 faces the active surfaces 206 of the first dies 207. In an embodiment, the first dies 207 may be fabricated at a first process node and the second die 210 may be fabricated at a second process node that is less advanced than the first process node. In an embodiment, a solder resist layer 242 may be located between the first dies 207 and the second die 210.

In an embodiment, the first dies 207 may be electrically coupled to the second die 210 with first level interconnects (FLIs) 218 and a via 246 through the solder resist layer 242. For example, pads 217 of the first dies 207 may be electrically coupled to the vias 246 by FLIs 218. The opposite surface of the vias 246 may be electrically coupled to pads 219 of the second die 210 by FLIs 218 as well. In an embodiment, the pads 219 of the second die 210 and the FLIs 218 between the vias 246 and the second die 210 may be surrounded by an underfill material 211. In an embodiment, the pads 217 of the first die 207 and the FLIs 218 between the first dies 207 may be surrounded by a different underfill material 211.

In a particular embodiment, the first dies 207 may be interconnected to each other through the second die 210. That is, the second die 210 may function as a patch to provide interconnections between each of the first dies 207. In some embodiments, the first dies 207 may all be substantially similar to each other. In other embodiments, the first dies 207 may comprise different functionalities. In the illustrated embodiment, four first dies 207 are shown. However, it is to be appreciated that an array of any number of first dies 207 (e.g., two or more) may be used in an electronic package 200.

In an embodiment, the HSIO dies 212 may also be electrically coupled to the second die 210. For example, the HSIO dies 212 may be electrically coupled to pads 219 on the second die 210 by FLIs 218 and vias 246 through the solder resist layer 242 in substantially the same manner the first dies 207 are connected to the second die 210. In an embodiment, the second die 210 may provide interconnections between the first dies 207 and the HSIO dies 212.

In an embodiment, a plurality of redistribution layers (RDLs) comprising conductive traces, pads 225, and vias 224 may be embedded in the mold layer 220. The RDLs may electrically couple surfaces of the first dies 207, the second die 210, and the HSIO dies 212 to mid-level interconnects (MLIs) 228 over the second surface 227 of the mold layer 220. In an embodiment, the MLIs 228 may be positioned in openings through a solder resist 222, as is known in the art.

Figure 2B:
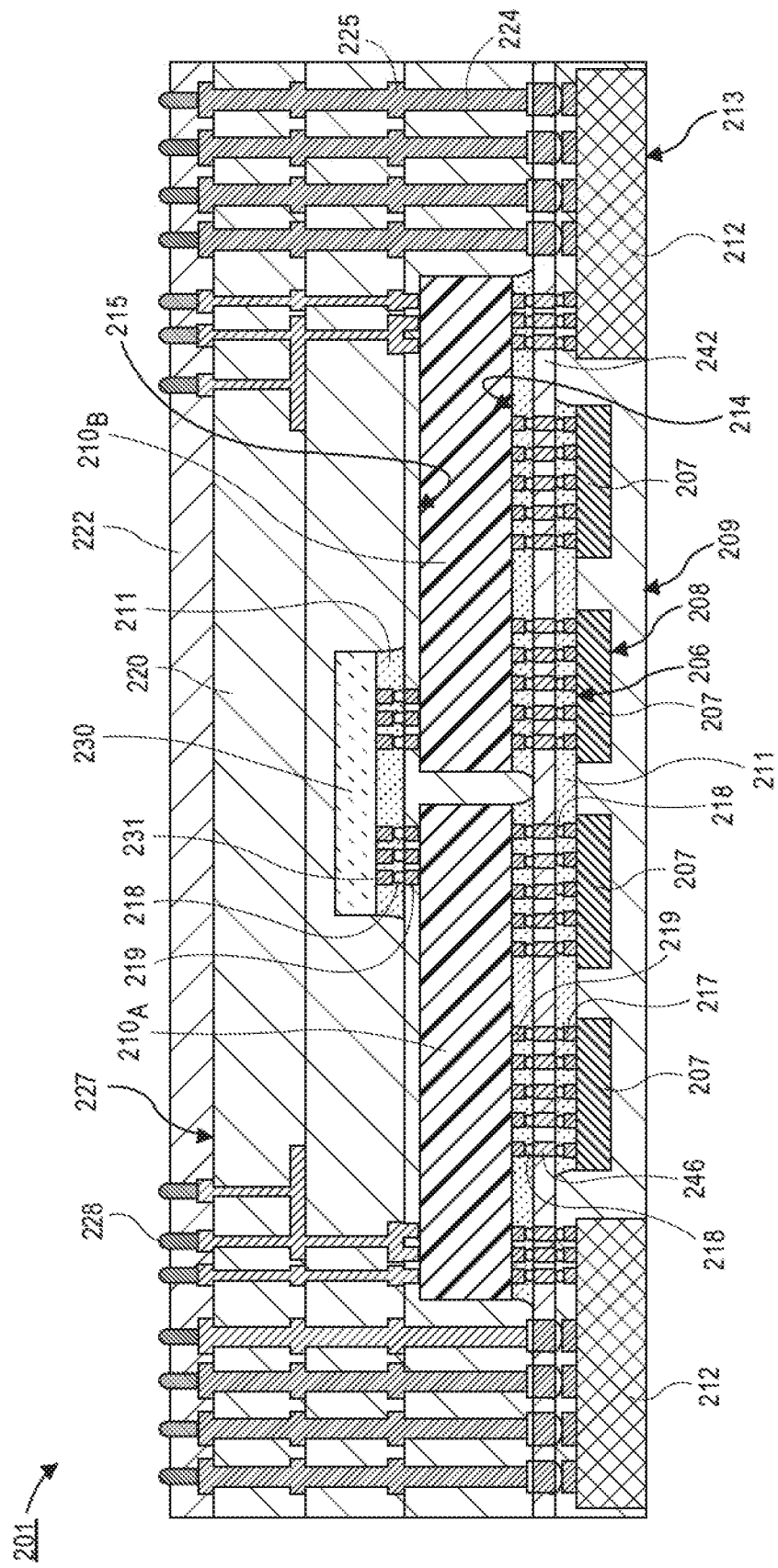
FIG. 2B is a cross-sectional illustration of a multi-die package that includes a plurality of first dies coupled to a plurality of second dies with a solder resist layer between the first dies and the second dies, where the second dies are coupled together by an embedded bridge, in accordance with an embodiment.

Referring now to FIG. 2B, a cross-sectional illustration of an electronic package 201 is shown, in accordance with an additional embodiment. In an embodiment, the electronic package 201 may be substantially similar to the electronic package 200 described above with respect to FIG. 2A, with the exception that a plurality of second dies 210 are included. In the illustrated embodiment, two second dies 210A and 210E are shown. However, it is to be appreciated that an array of any number of second dies 210 (e.g., two or more) may be included in electronic package 201.

In an embodiment, the second dies 210 may be electrically coupled together with one or more bridges 230. The bridge 230 may be an EMIB or the like. For example, the bridge 230 may include pads 231 with fine pitch that is suitable for connecting to pads 219 on the backside surface 215 of the second dies 210. For example, FLIs 218 may electrically couple pads 231 to pads 219. In an embodiment, the pads 231 and FLIs 218 may be surrounded by an underfill material 211, and the pads 219 on the backside surface 215 of the second dies 210 may be surrounded by the mold layer 220.

The interconnection of an array of second dies 210 with one or more bridges 230 provides a die tiling architecture. That is, the plurality of second dies 210 may function as a single die. This may be particularly beneficial when the combined area of the second dies exceeds the reticle limit of the process node used to fabricate the second dies 210.

Referring now to FIGS. 3A-3J, a series of cross-sectional illustrations depicting a process for fabricating an electronic package 300 similar to the electronic package 100 described in FIG. 1A is shown, in accordance with an embodiment. As will be apparent, the process includes mounting the first dies 307 early in the assembly process in order to provide improved alignment that is not susceptible to variations arising from warpage.

Figure 3A:
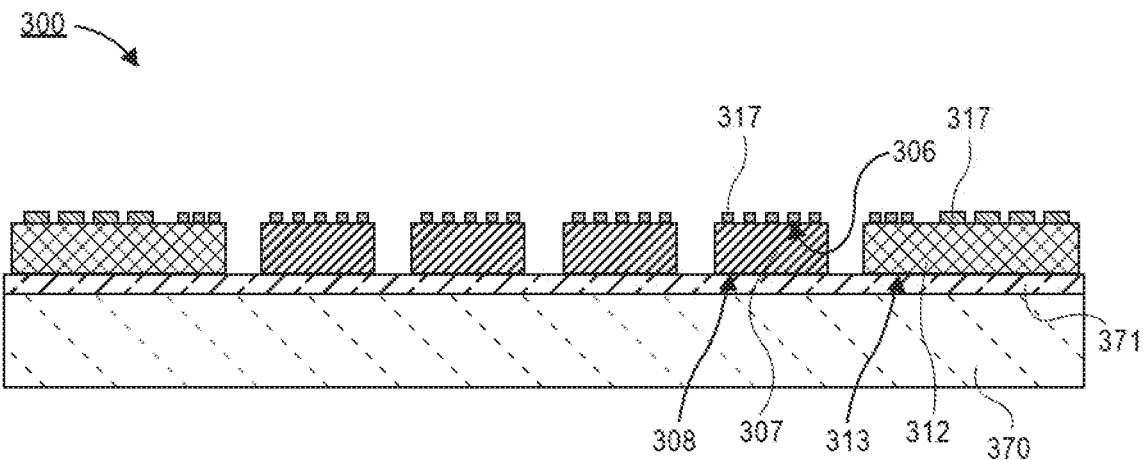
FIG. 3A is a cross-sectional illustration of a plurality of first dies mounted to a carrier substrate, in accordance with an embodiment.

Referring now to FIG. 3A, a cross-sectional illustration of an electronic package 300 after placement of the first dies 307 is shown, in accordance with an embodiment. In an embodiment, the first dies 307 may be attached to a release layer 371 over a carrier 370. The carrier 370 may be a dimensionally stable material that is not susceptible to significant warpages. For example, the carrier 370 may be a glass carrier.

In an embodiment, the first dies 307 may be mounted to the release layer with a die mounter tool. The use of a die mounter tool to place the first dies 307 provides improved placement accuracy compared to TCB tools. A die mounter tool typically has a placement precision that is an order of magnitude better than TCB tools. For example, a TCB tool typically has a precision of ±15 µm whereas a die mounter tool has a precision of ±5 µm.

In an embodiment, the first dies 307 are mounted to the release layer 371 with a backside surface 308 interfacing with the release layer 371. Accordingly, an active surface 306 and pads 317 on the active surface 306 of the first dies 307 are facing away from the carrier 370. In an embodiment, a plurality of HSIO dies 312 may also be mounted to the release layer 371. A backside surface 313 of the HSIO dies 312 may interface with the release layer 371 with pads 317 facing away from the carrier 370. Accordingly, the backside surfaces 308 of the first dies 307 may be substantially coplanar with backside surfaces 313 of the HSIO dies 312.

Figure 3B:
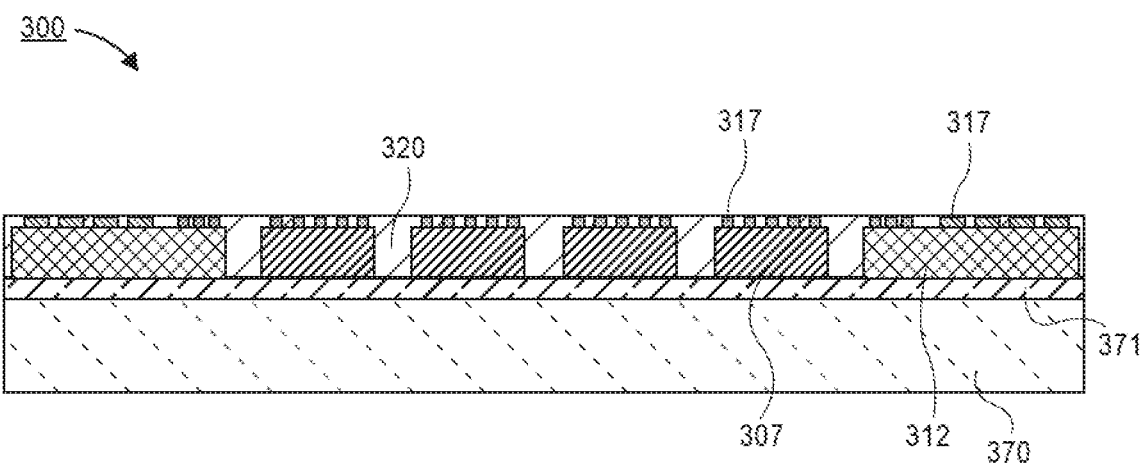
FIG. 3B is a cross-sectional illustration after a mold layer is disposed over the plurality of first dies, in accordance with an embodiment.

Referring now to FIG. 3B, a cross-sectional illustration of the electronic package 300 after a mold layer 320 is disposed over the first dies 307, the HSIO dies 312 and the carrier 370 is shown, in accordance with an embodiment. In an embodiment, the mold layer 320 may be disposed and planarized in order to expose surfaces of the pads 317 of the first dies 307 and the HSIO dies 312. The mold layer 320 may be planarized with a grinding or polishing process, as is known in the art.

Figure 3C:
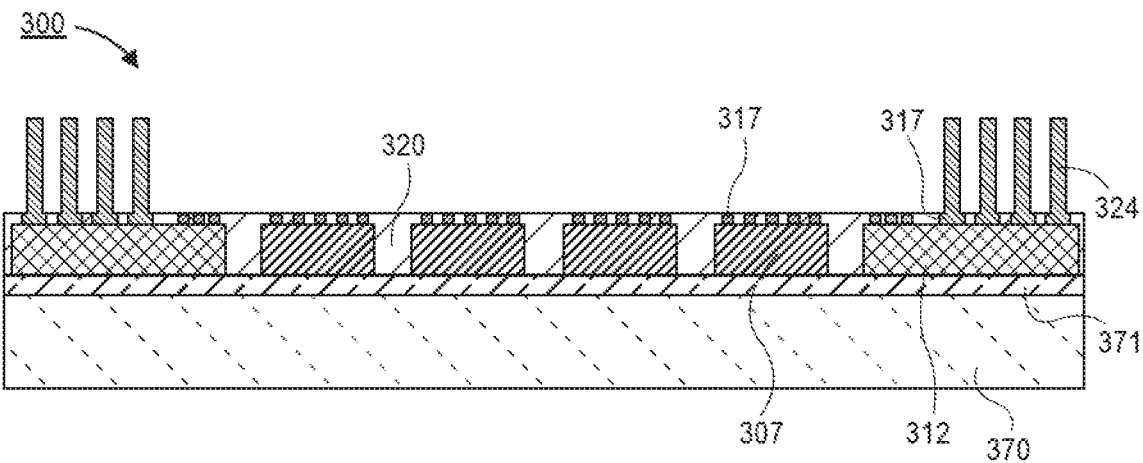
FIG. 3C is a cross-sectional illustration after pillars are formed over the mold layer, in accordance with an embodiment.

Referring now FIG. 3C, a cross-sectional illustration of the electronic package 300 after vias 324 are fabricated over selected pads 317 is shown, in accordance with an embodiment. In an embodiment, the vias 324 may be conductive pillars or any other suitable conductive feature for forming vias in an electronic package. In an embodiment, the vias 324 may be fabricated over pads 317 on the HSIO dies 312.

Figure 3D:
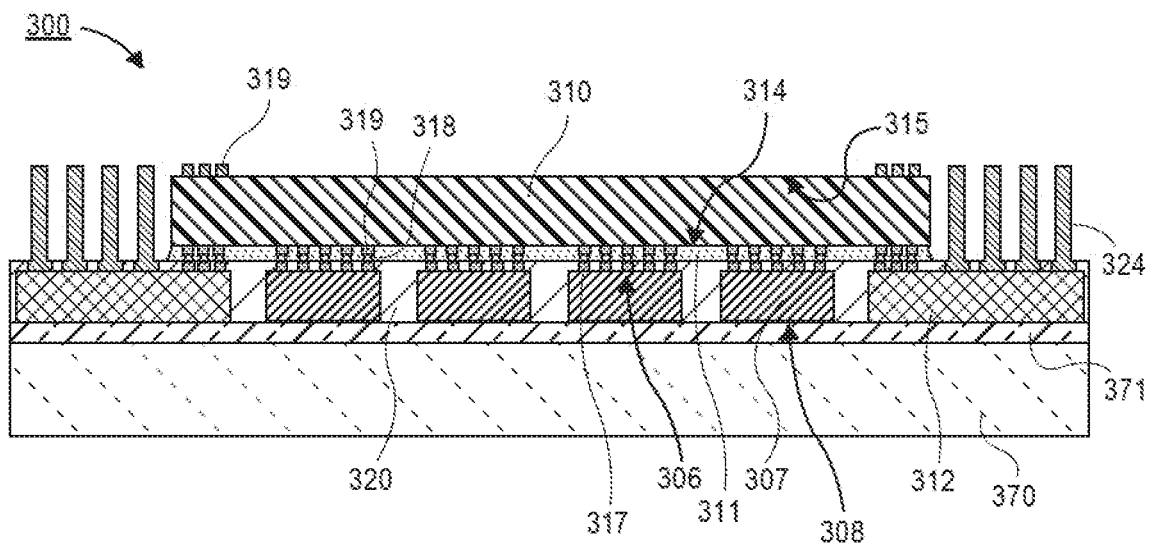
FIG. 3D is a cross-sectional illustration after a second die is attached to the first dies, in accordance with an embodiment.

Referring now to FIG. 3D, a cross-sectional illustration of the electronic package after a second die 310 is attached to the first dies 307 and the HSIO dies 312 is shown, in accordance with an embodiment. In an embodiment, the second die 310 may be attached with a TCB tool. Since the TCB attach happens in the early stages of package assembly (and with the dimensionally stable carrier 370 still in place) the impact of warpage is minimal. Accordingly, yield loss is minimal or none.

In an embodiment, the second die 310 may be coupled to the first dies 307 and the HSIO dies 312 with FLIs 318. For example, C4 bumps may electrically couple pads 317 of the first dies 307 and the HSIO dies 312 to pads 319 of the second die 310. In an embodiment, an underfill material 311 may surround the FLIs 318 and the pads 319 of the second die 310.

In an embodiment, the second die 310 may be mounted to the first dies 307 in a face-to-face configuration. That is, an active surface 314 of the second die 310 may face the active surface 306 (i.e., the surface below pads 317) of the first dies 307. In an embodiment, pads 319 may also be formed over a backside surface 315 of the second die 310. The pads 319 over the backside surface 315 may be pads for through substrate vias (TSVs) (not shown) that allow for electrical connections to pass through the second die 310 from the active surface 314 to the backside surface 315. In an embodiment, the first dies 307 may be fabricated at a first process node and the second die 310 may be fabricated at a second process node that is less advanced than the first process node.

Figure 3E:
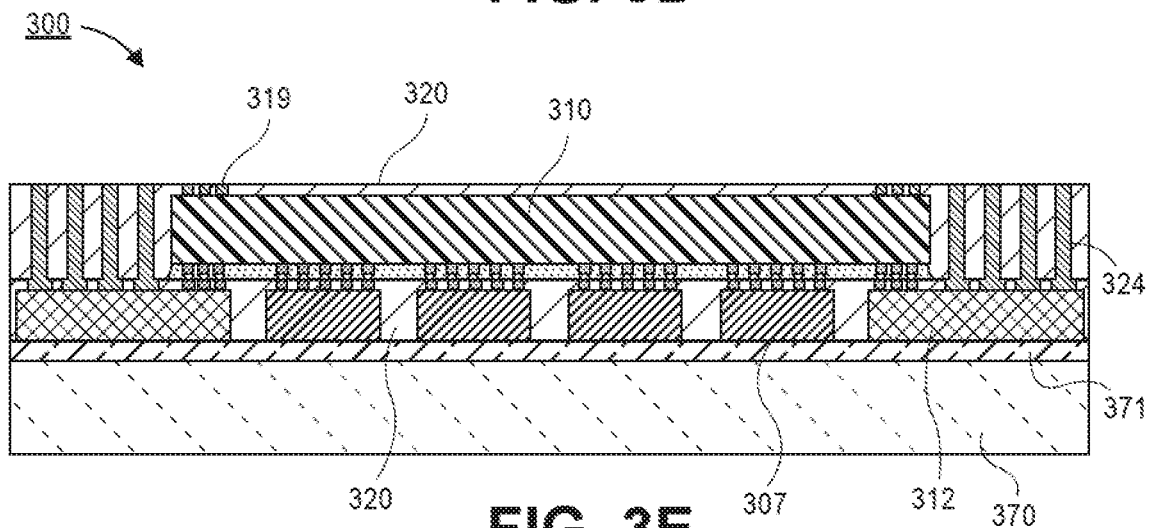
FIG. 3E is a cross-sectional illustration after a mold layer is disposed over the second die, in accordance with an embodiment.

Referring now to FIG. 3E, a cross-sectional illustration of the electronic package 300 after a mold layer 320 is disposed over and around the second die 310 and the vias 324 is shown, in accordance with an embodiment. In an embodiment, the mold layer 320 may be planarized (e.g., with polishing or grinding) to expose surfaces of the pads 319 and the vias 324.

Figure 3F:
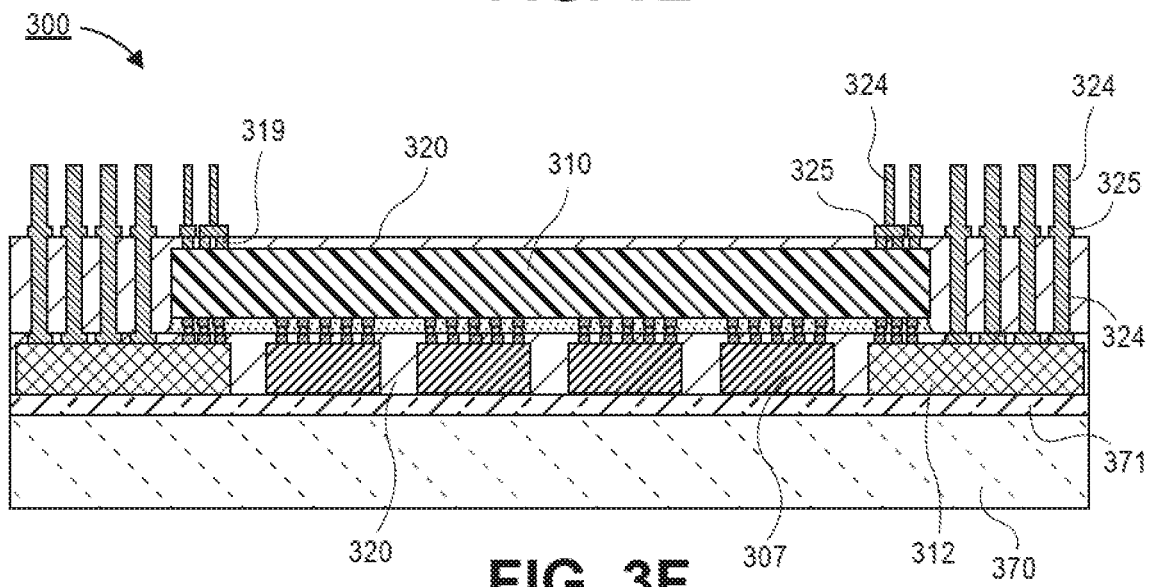
FIG. 3F is a cross-sectional illustration after pillars are formed over the mold layer, in accordance with an embodiment.

Referring now to FIG. 3F, a cross-sectional illustration of the electronic package 300 after pads 325 and vias 324 are formed is shown, in accordance with an embodiment. In an embodiment, the pads 325 and the vias 324 may be for a redistribution layer (RDL) formed above the second die 310.

Figure 3G:
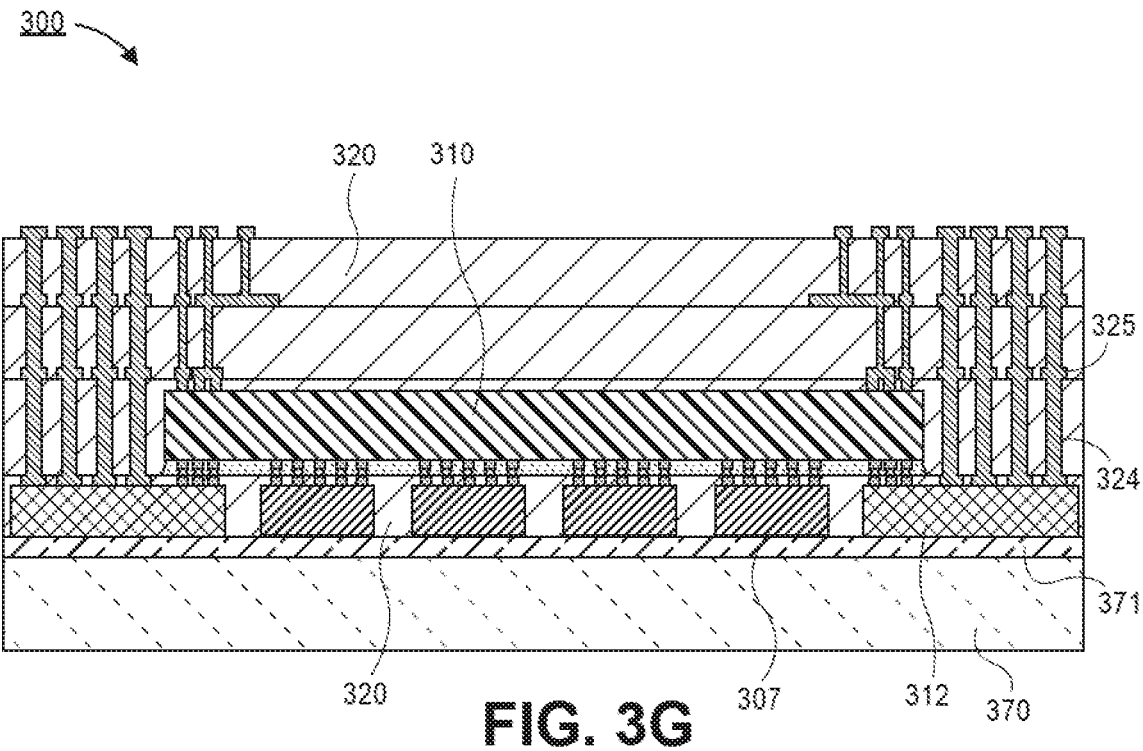
FIG. 3G is a cross-sectional illustration after a redistribution layer (RDL) is formed over the mold layer, in accordance with an embodiment.

Referring now to FIG. 3G, a cross-sectional illustration of the electronic package 300 after additional RDLs are formed is shown, in accordance with an embodiment. In an embodiment, the RDLs may comprise pads 325 and vias 324 embedded in a mold layer 320. In an embodiment, the RDLs are fabricated with a lithographic via process (e.g., pad/via formation, molding, mold grinding/polishing to expose the vias, etc.). In other embodiments, the RDLs may be fabricated with a suitable semi-additive process (SAP) using traditional High Density Interconnect (HDI) organic build-up dielectric layers, plating, and the like. As shown in FIG. 3G, the mold layer 320 includes a plurality of distinguishable layers. However, it is to be appreciated that in some embodiments there may be no discernable boundary between layers of the mold layer 320.

Figure 3H:
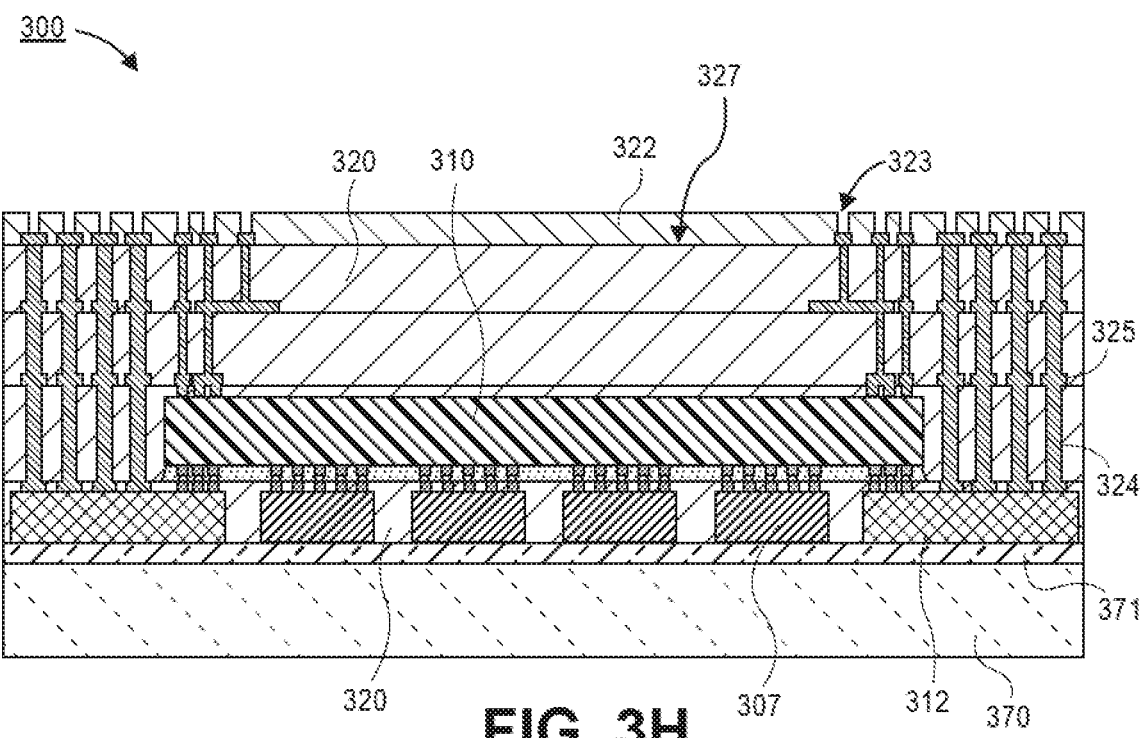
FIG. 3H is a cross-sectional illustration after a solder resist layer is disposed over the RDL and patterned, in accordance with an embodiment.

Referring now to FIG. 3H, a cross-sectional illustration of the electronic package 300 after a solder resist layer 322 is disposed over a surface 327 of the mold layer 320 and patterned is shown, in accordance with an embodiment. In an embodiment, the resist layer is patterned to form a plurality of openings 323 that expose pads 325 over the mold layer 320.

Figure 3I:
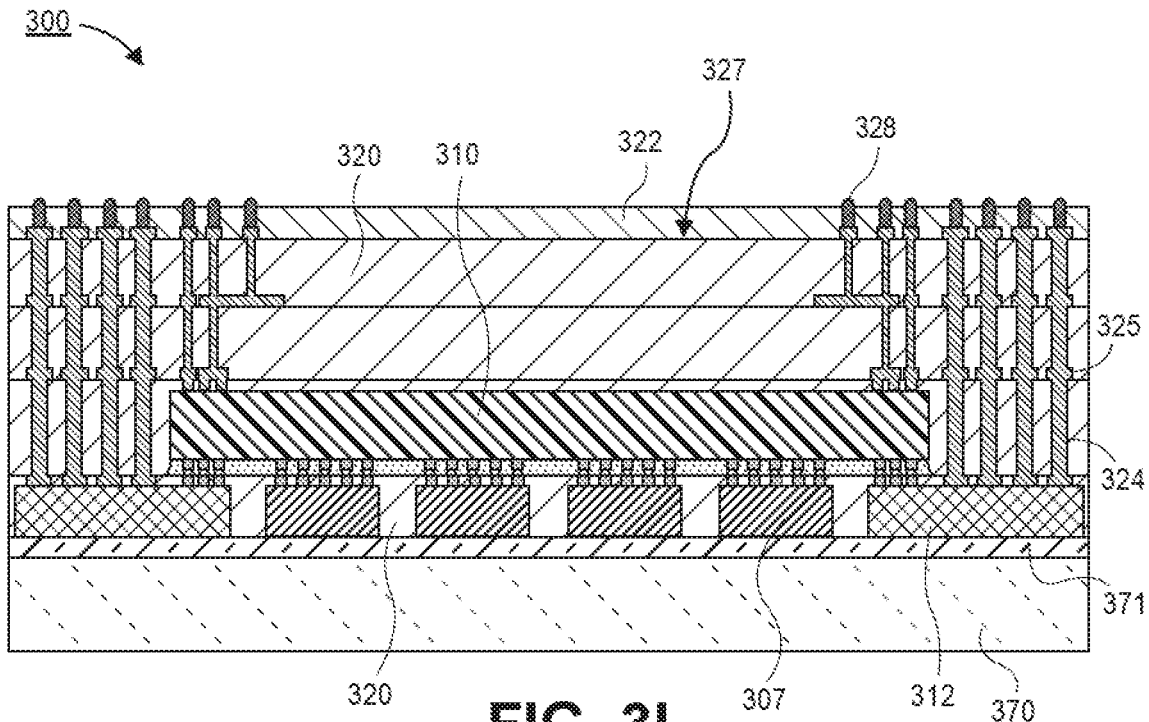
FIG. 3I is a cross-sectional illustration after mid-level interconnects (MLIs) are disposed through the solder resist layer, in accordance with an embodiment.

Referring now to FIG. 3I, a cross-sectional illustration of the electronic package 300 after MLIs 328 are disposed in the openings 323 is shown, in accordance with an embodiment. In an embodiment, the MLIs 328 may comprise a solder or the like. Furthermore, it is to be appreciated that the MIL formation is implemented while the dimensionally stable carrier is still attached to the electronic package 300. Accordingly, the attachment of an additional carrier is not needed, as is the case with previously disclosed approaches.

Figure 3J:
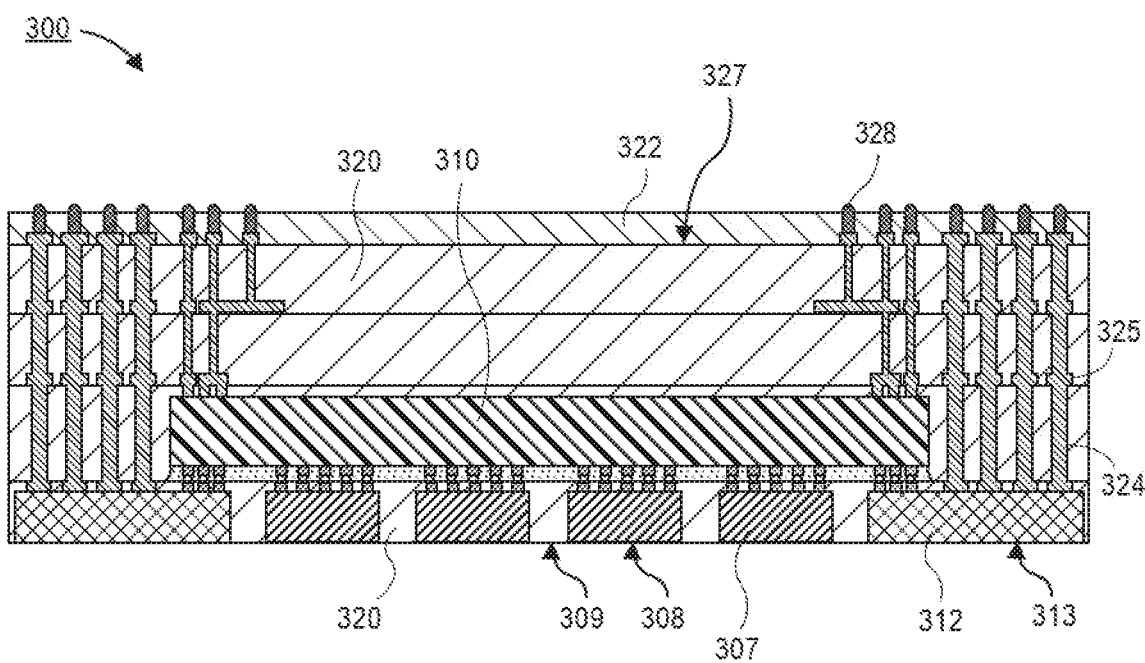
FIG. 3J is a cross-sectional illustration after the carrier is removed, in accordance with an embodiment.

Referring now to FIG. 3J, a cross-sectional illustration of the electronic package 300 after the carrier 370 and the release layer 371 are removed is shown, in accordance with an embodiment. In an embodiment, any release layer residue may be removed with typical wet or dry cleaning methods, as is known in the art. After cleaning, the package 300 may be singulated to have the desired size.

As shown in FIG. 3J, backside surfaces 308 of the first dies 307 are exposed. Accordingly, thermal management of the electronic package 300 is improved. In some embodiments, a thermal solution (e.g., a heat sink, a heat spreader, etc.) may be coupled to the backside surfaces 308 of the first dies 307. In an embodiment, the backside surfaces 308 of the first dies 307 may be substantially coplanar with the backside surfaces 313 of the HSIO dies 312 and the surface 309 of the mold layer 320.

Referring now to FIGS. 4A-4D, a series of cross-sectional illustrations depicting a process of forming an electronic package 401 similar to the electronic package 101 described with respect to FIG. 1B is shown, in accordance with an embodiment.

Figure 4A:
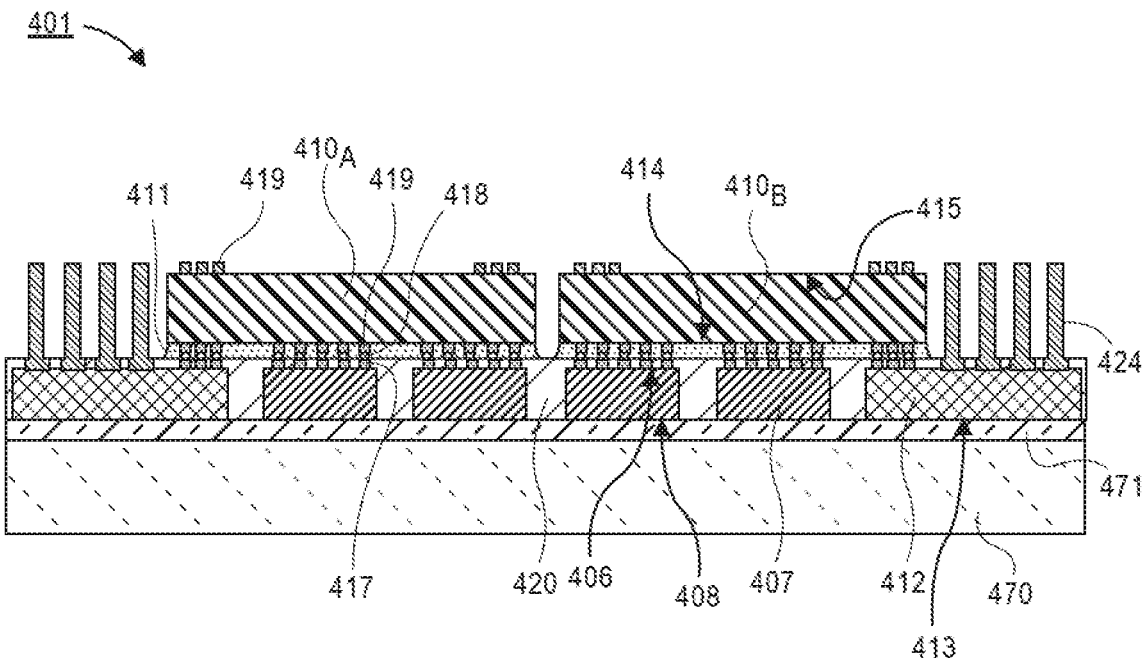
FIG. 4A is a cross-sectional illustration of an electronic package after a plurality of second dies are attached to a plurality of first dies, in accordance with an embodiment.

Referring now to FIG. 4A, a cross-sectional illustration of an electronic package 401 after a plurality of second dies 410 are attached to first dies is shown, in accordance with an embodiment. In an embodiment, the incoming electronic package 401 may be fabricated with substantially similar processing operations described with respect to FIGS. 3A-3C. For example, the backside surfaces 408 of first dies 407 and backside surfaces 413 of HSIO dies 412 may be mounted to a release layer 471 over a dimensionally stable carrier 470, and vias 424 may be formed over the HSIO dies 412.

In an embodiment, the second dies 410A and 410E may be attached to the first dies 407 with a TCB tool. Since the TCB attach happens in the early stages of package assembly (and with the dimensionally stable carrier 470 still in place) the impact of warpage is minimal. Accordingly, yield loss is minimal or none.

In an embodiment, the second dies 410A and 410E may be coupled to the first dies 407 and the HSIO dies 412 with FLIs 418. For example, C4 bumps may electrically couple pads 417 of the first dies 407 and the HSIO dies 412 to pads 419 of the second dies 410. In an embodiment, an underfill material 411 may surround the FLIs 418 and the pads 419 of the second die 410.

In an embodiment, the second dies 410 may be mounted to the first dies 407 in a face-to-face configuration. That is, an active surface 414 of the second dies 410 may face the active surface 406 of the first dies 407. In an embodiment, pads 419 may also be formed over a backside surface 415 of the second die 410. The pads 419 over the backside surface 415 may be pads for through substrate vias (TSVs) (not shown) that allow for electrical connections to pass through the second die 410 from the active surface 414 to the backside surface 415. In an embodiment, the first dies 407 may be fabricated at a first process node and the second dies 410 may be fabricated at a second process node that is less advanced than the first process node.

Figure 4B:
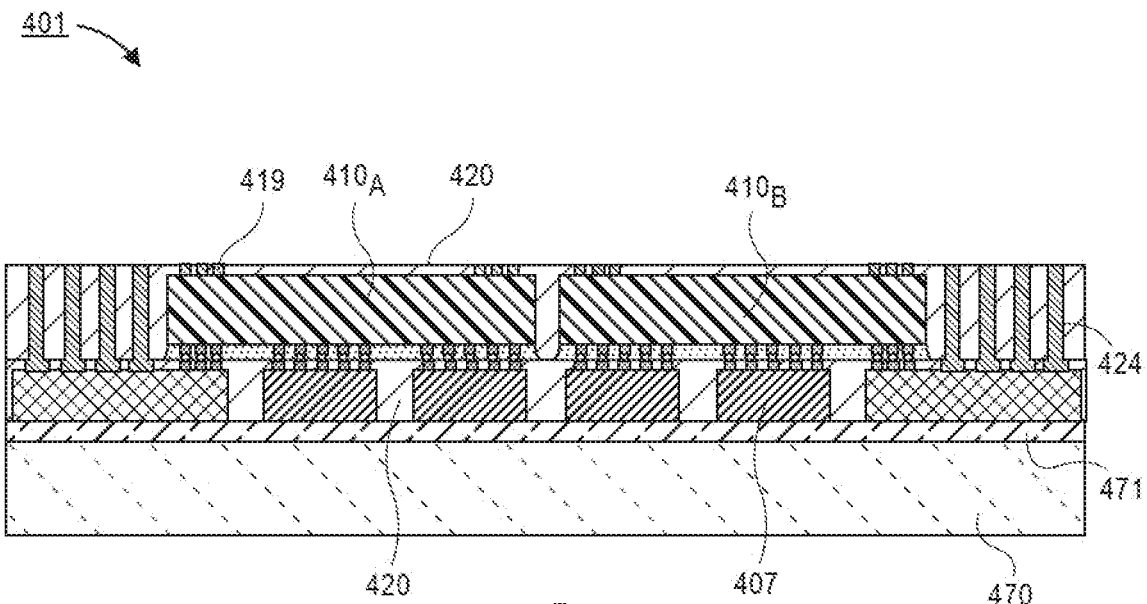
FIG. 4B is a cross-sectional illustration after a mold layer is disposed over the second dies, in accordance with an embodiment.

Referring now to FIG. 4B, a cross-sectional illustration of the electronic package 401 after a mold layer 420 is disposed over and around the second die 410 and the vias 424 is shown, in accordance with an embodiment. In an embodiment, the mold layer 420 may be planarized (e.g., with polishing or grinding) to expose surfaces of the pads 419 and the vias 424.

Figure 4C:
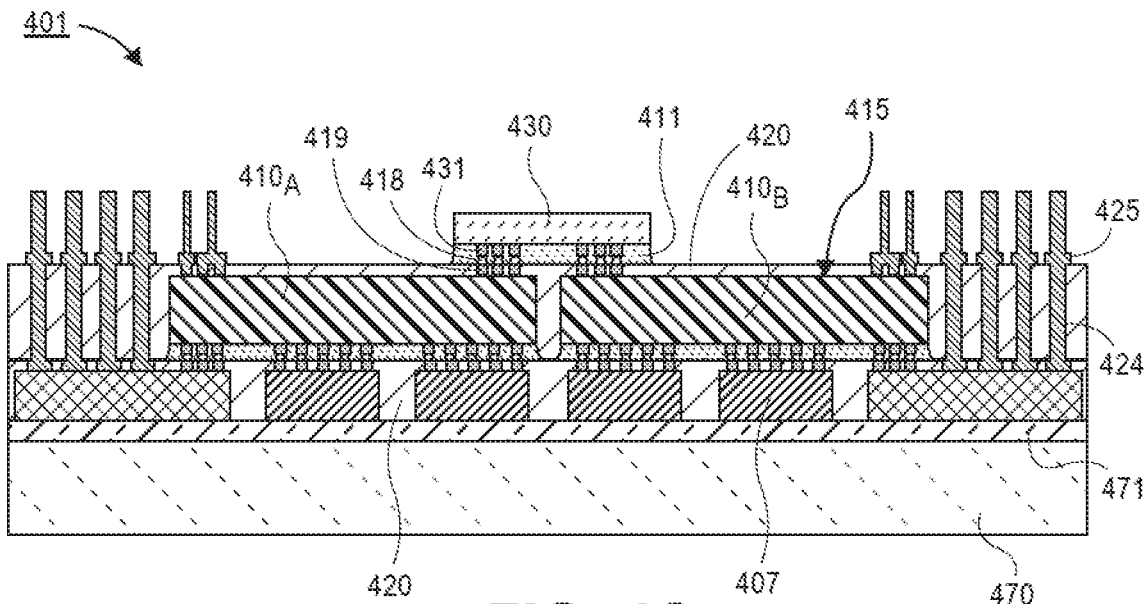
FIG. 4C is a cross-sectional illustration after a bridge is attached across the second dies, in accordance with an embodiment.

Referring now to FIG. 4C, a cross-sectional illustration of the electronic package 401 after a bridge 430 is attached across the second dies 410A and 410E is shown, in accordance with an embodiment. In an embodiment, the bridge 430 may be an EMIB or the like that provides electrical coupling between second dies 410A and 410B. The interconnection of an array of second dies 410 with one or more bridges 430 provides a die tiling architecture. That is, the plurality of second dies 410 may function as a single die. This may be particularly beneficial when the combined area of the second dies 410 exceeds the reticle limit of the process node used to fabricate the second dies 410.

In an embodiment, the bridge 430 may comprise pads 431 that are electrically coupled to pads 419 on the backside surface 415 of the second dies 410. In an embodiment the pads 419 may be electrically coupled to pads 431 with FLIs 418. The pads 431 and the FLIs 418 may be surrounded by an underfill material 411. While a single bridge 430 is shown in FIG. 4C, it is to be appreciated that electronic package 401 may comprise a plurality of bridges 430 to provide connections between any number of second dies 410.

Figure 4D:
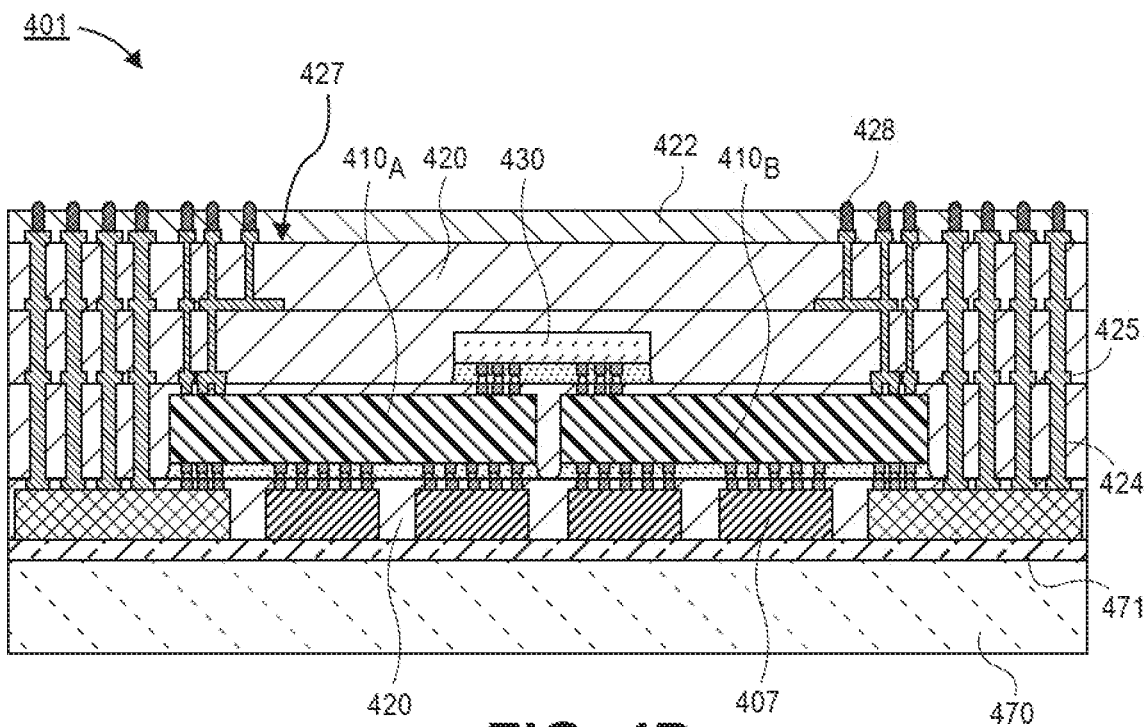
FIG. 4D is a cross-sectional illustration after mold layers and RDLs are formed over the second dies, in accordance with an embodiment.

Referring now to FIG. 4D, a cross-sectional illustration of the electronic package after RDLs comprising pads 425, vias 424, and mold layers 420 is fabricated over the second dies 410 is shown, in accordance with an embodiment. In an embodiment, the RDLs may be fabricated with a lithographic via process or with standard SAP processes. In an embodiment, a solder resist 422 may be formed over a surface 427 of the mold layer 420. MLIs 428 may pass through the solder resist 422 to provide connections to pads 425. Furthermore, it is to be appreciated that the MIL formation is implemented while the dimensionally stable carrier is still attached to the electronic package 401. Accordingly, the attachment of an additional carrier is not needed, as is the case with previously disclosed approaches.

Figure 4E:
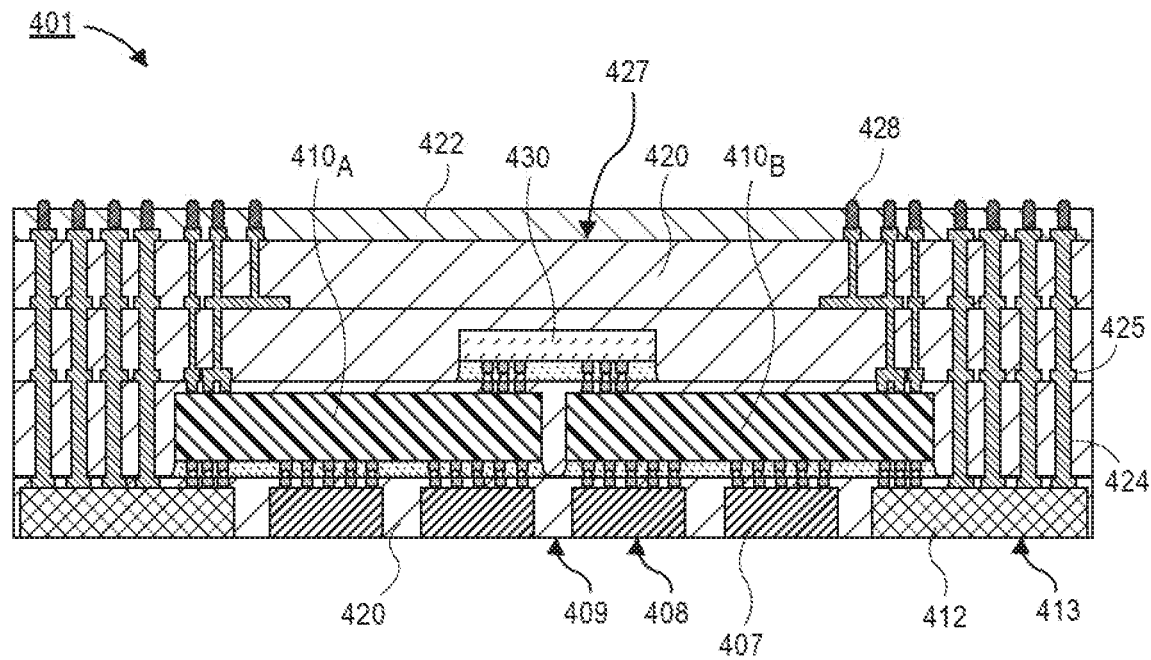
FIG. 4E is a cross-sectional illustration after the carrier is removed, in accordance with an embodiment.

Referring now to FIG. 4E, a cross-sectional illustration of the electronic package 401 after the carrier 470 and the release layer 471 are removed is shown, in accordance with an embodiment. In an embodiment, any release layer residue may be removed with typical wet or dry cleaning methods, as is known in the art. After cleaning, the package 401 may be singulated to have the desired size.

As shown in FIG. 4E, backside surfaces 408 of the first dies 407 are exposed. Accordingly, thermal management of the electronic package 401 is improved. In some embodiments, a thermal solution (e.g., a heat sink, a heat spreader, etc.) may be coupled to the backside surfaces 408 of the first dies 407. In an embodiment, the backside surfaces 408 of the first dies 407 may be substantially coplanar with the backside surfaces 413 of the HSIO dies 412 and the surface 409 of the mold layer 420.

Referring now to FIGS. 5A-5G, a series of cross-sectional illustrations depicting a process to form an electronic package 500 similar to the electronic package 200 shown in FIG. 2A is shown, in accordance with an embodiment.

Figure 5A:
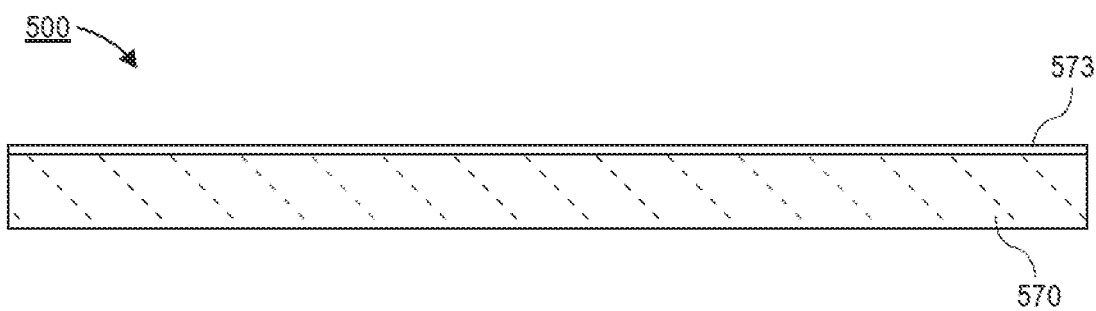
FIG. 5A is a cross-sectional illustration of a first carrier with a seed layer, in accordance with an embodiment.

Referring now to FIG. 5A, a cross-sectional illustration of a first carrier 570 with a seed layer 573 is shown, in accordance with an embodiment. In an embodiment, the first carrier 570 may be any dimensionally stable carrier, such as glass.

Figure 5B:
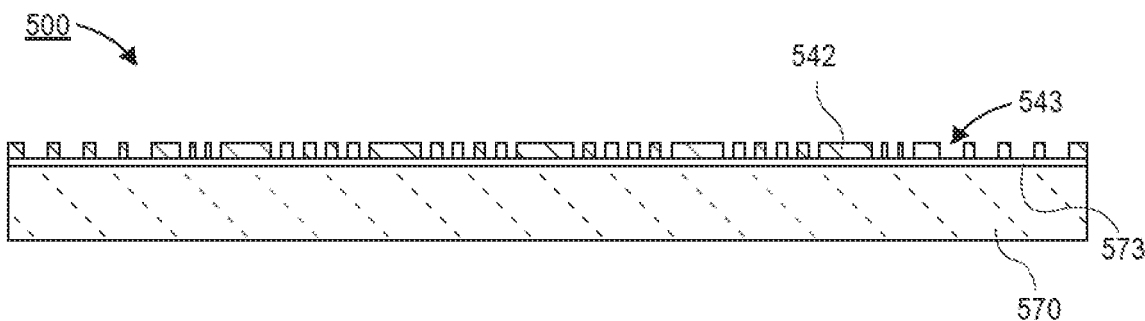
FIG. 5B is a cross-sectional illustration after a solder resist layer is disposed over the seed layer and patterned, in accordance with an embodiment.

Referring now to FIG. 5B, a cross-sectional illustration of the electronic package 500 after a solder resist layer 542 with patterned openings 543 is disposed over the seed layer 573 is shown, in accordance with an embodiment. The solder resist layer 542 may be disposed with a lamination process, or the like.

Figure 5C:
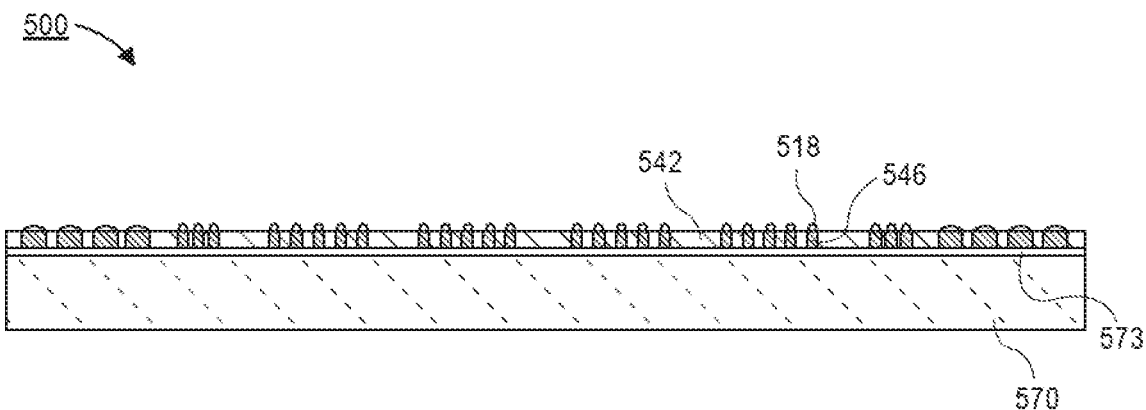
FIG. 5C is a cross-sectional illustration after interconnects are disposed into the solder resist openings, in accordance with an embodiment.

Referring now to FIG. 5C, a cross-sectional illustration of the electronic package 500 after vias 546 and FLIs 518 are disposed in the openings 543 is shown, in accordance with an embodiment. In an embodiment, the vias 546 may be copper or the like, and the FLIs 518 may be solder bumps or the like.

Figure 5D:
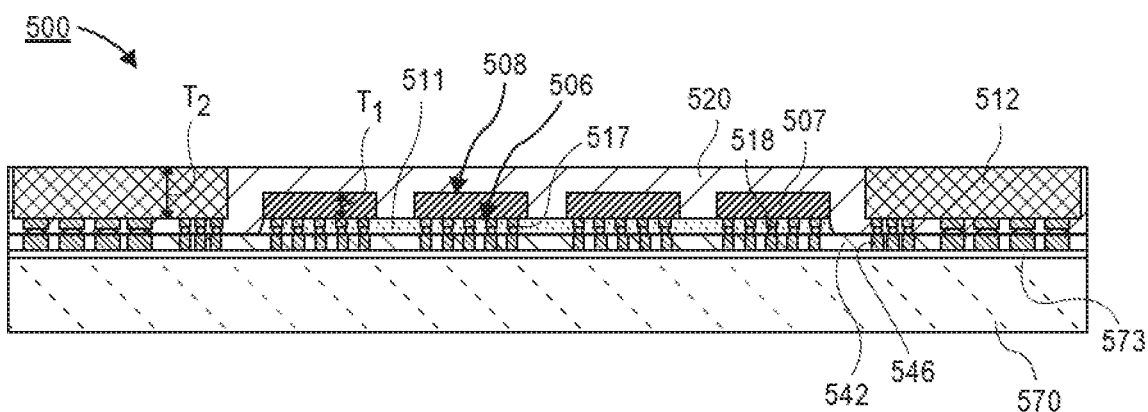
FIG. 5D is a cross-sectional illustration after first dies are attached to the interconnects, in accordance with an embodiment.

Referring now to FIG. 5D, a cross-sectional illustration of the electronic package 500 after first dies 507 and HSIO dies 512 are mounted is shown, in accordance with an embodiment. In an embodiment, the first dies 507 and the HSIO dies 512 may be mounted to FLIs 518 with a TCB tool. Accordingly, pads 517 may be attached to the FLIs 518. The pads 517 and FLIs 518 may be surrounded by an underfill material 511. As shown, the first dies 507 may be attached with a face down configuration. That is, active surfaces 506 of the first dies 507 may face towards the first carrier 570 and backside surfaces 508 of the first dies 507 may face away from the first carrier 570.

In an embodiment, the face down configuration provides an advantage in that thicknesses of the first dies 507 and the HSIO dies 512 need not be the same. For example, first dies 507 may have a first thickness $T_1$ and HSIO dies 512 may have a second thickness $T_2$ that is different (e.g., greater) than the first thickness $T_1$. In an embodiment, a mold layer 520 may be disposed over and around the first dies 507 and the HSIO dies 512 after they have been mounted to the first carrier 570. In some embodiments, the molded layer 520 may be recessed with a grinding or polishing process to expose the HSIO die back surface.

Figure 5E:
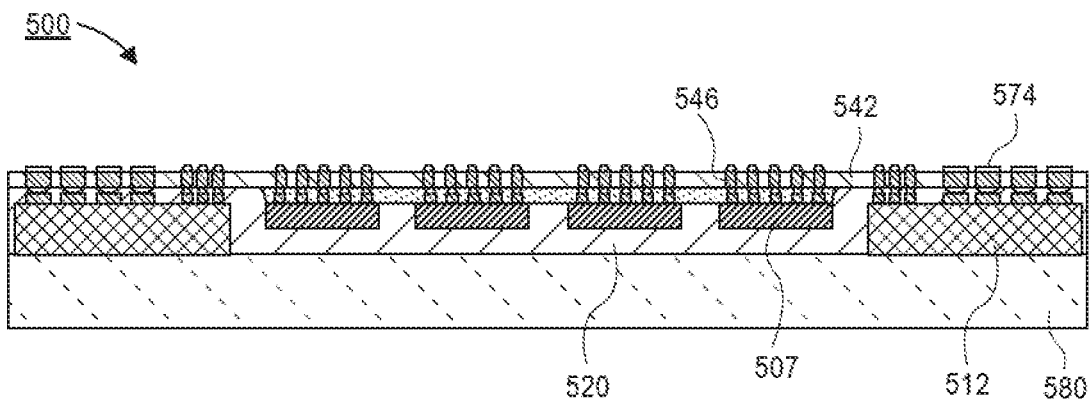
FIG. 5E is a cross-sectional illustration after the first carrier is removed and a second carrier is attached to the package, in accordance with an embodiment.

Referring now to FIG. 5E, a cross-sectional illustration of the electronic package 500 after the first carrier 570 is removed and a second carrier 580 is attached to an opposing surface of the electronic package 500. As shown, the second carrier 580 may interface with the mold layer 520 and the solder resist 542 is now facing upwards away from the second carrier 580. In an embodiment, the seed layer 573 may be patterned to form pads 574 over the vias 546.

Figure 5F:
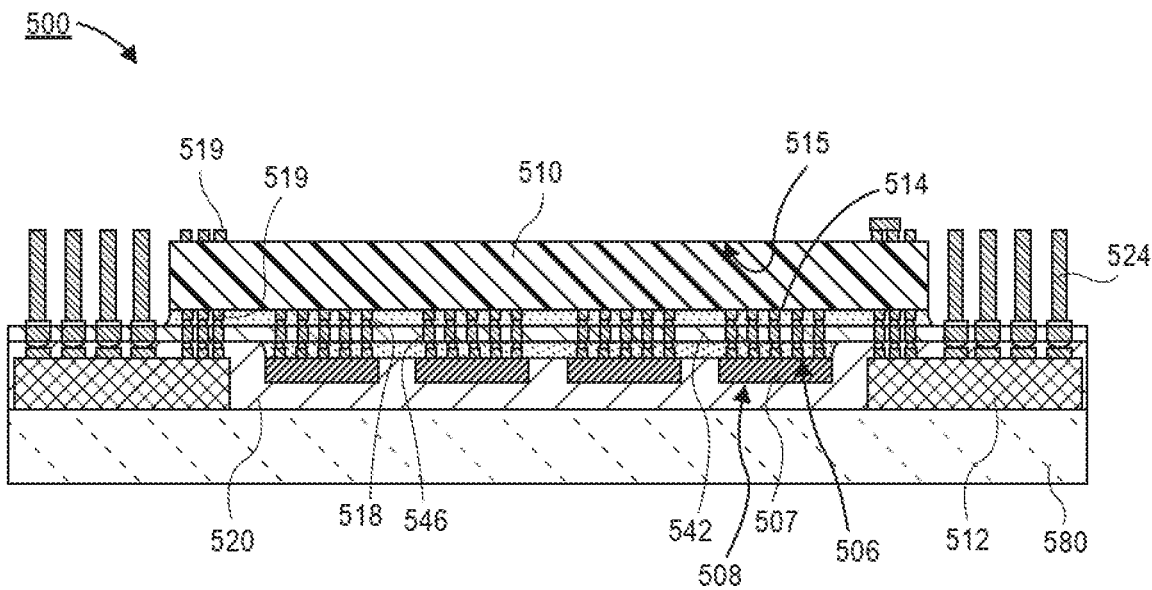
FIG. 5F is a cross-sectional illustration after a second die is attached to the first dies, in accordance with an embodiment.

Referring now to FIG. 5F, a cross-sectional illustration of the electronic package 500 after vias 524 are fabricated and a second die 510 is attached to the first dies 507 and the HSIO dies 512 is shown, in accordance with an embodiment. In an embodiment, the second die 510 may be attached with a TCB tool. Since the TCB attach happens in the early stages of package assembly (and with the dimensionally stable second carrier 580 still in place) the impact of warpage is minimal. Accordingly, yield loss is minimal or none.

In an embodiment, the second die 510 may be coupled to the first dies 507 and the HSIO dies 512 with FLIs 518. For example, FLIs 518 may couple pads 519 of the second die 510 to the vias 546 through the solder resist 542. In an embodiment, an underfill material 511 may surround the FLIs 518 and the pads 519 of the second die 510.

In an embodiment, the second die 510 may be mounted to the first dies 507 in a face-to-face configuration. That is, an active surface 514 of the second die 510 may face the active surface 506 of the first dies 507. In an embodiment, pads 519 may also be formed over a backside surface 515 of the second die 510. The pads 519 over the backside surface 519 may be pads for through substrate vias (TSVs) (not shown) that allow for electrical connections to pass through the second die 510 from the active surface 514 to the backside surface 515. In an embodiment, the first dies 507 may be fabricated at a first process node and the second die 510 may be fabricated at a second process node that is less advanced than the first process node.

Figure 5G:
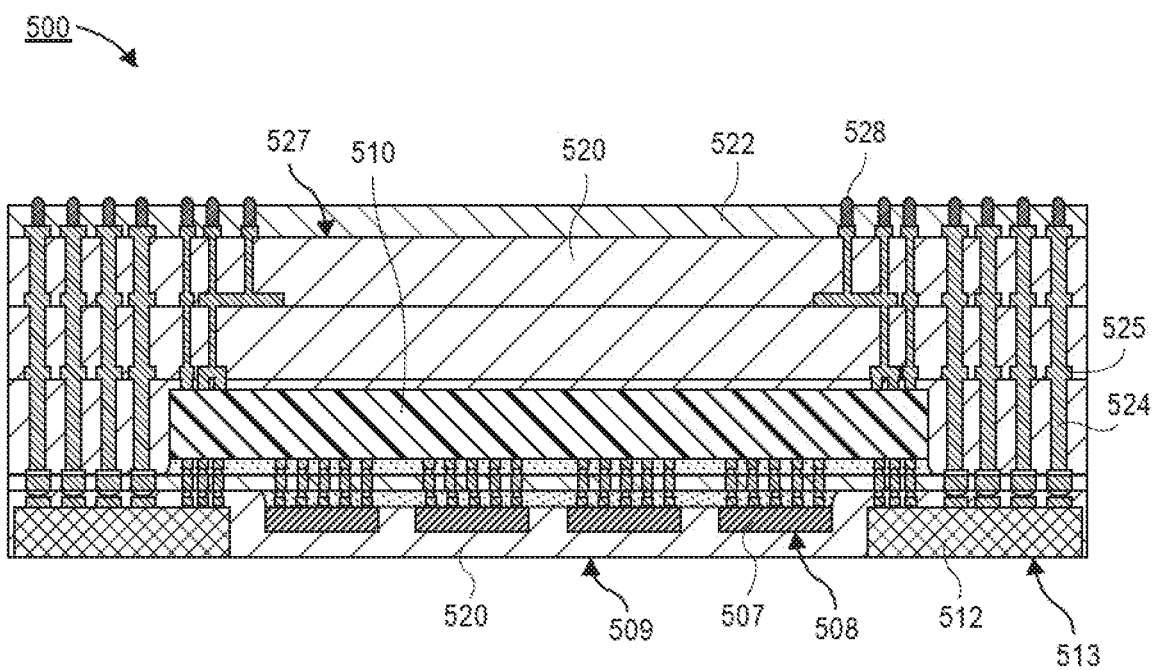
FIG. 5G is a cross-sectional illustration after RDLs are formed over the second die and the second carrier is removed, in accordance with an embodiment.

Referring now to FIG. 5G, a cross-sectional illustration after RDLs comprising pads 525 and vias 524 are formed and the second carrier 580 is removed is shown, in accordance with an embodiment. In an embodiment, the RDLs are fabricated with a lithographic via process or a SAP process, as is known in the art. As shown in FIG. 5G, the mold layer 520 includes a plurality of distinguishable layers. However, it is to be appreciated that in some embodiments there may be no discernable boundary between layers of the mold layer 520.

In an embodiment a solder resist layer 522 is disposed over a surface 527 of the mold layer 520. In an embodiment, the resist layer is patterned and MLIs 528 may be disposed. In an embodiment, the MLIs 528 may comprise a solder or the like. Furthermore, it is to be appreciated that the MLI formation is implemented while the dimensionally stable second carrier 580 is still attached to the electronic package 500. Accordingly, the attachment of an additional carrier is not needed, as is the case with previously disclosed approaches.

In an embodiment the second carrier 580 is removed to expose a surface 509 of the mold layer 520. As shown in FIG. 5G, backside surfaces 508 of the first dies 507 are embedded in the mold layer 520. The backside surface 513 of the HSIO dies 512 are exposed in some embodiments. However, in other embodiments, the backside surface 513 of the HSIO dies 512 may also be embedded in the mold layer 520.

Figure 6A:
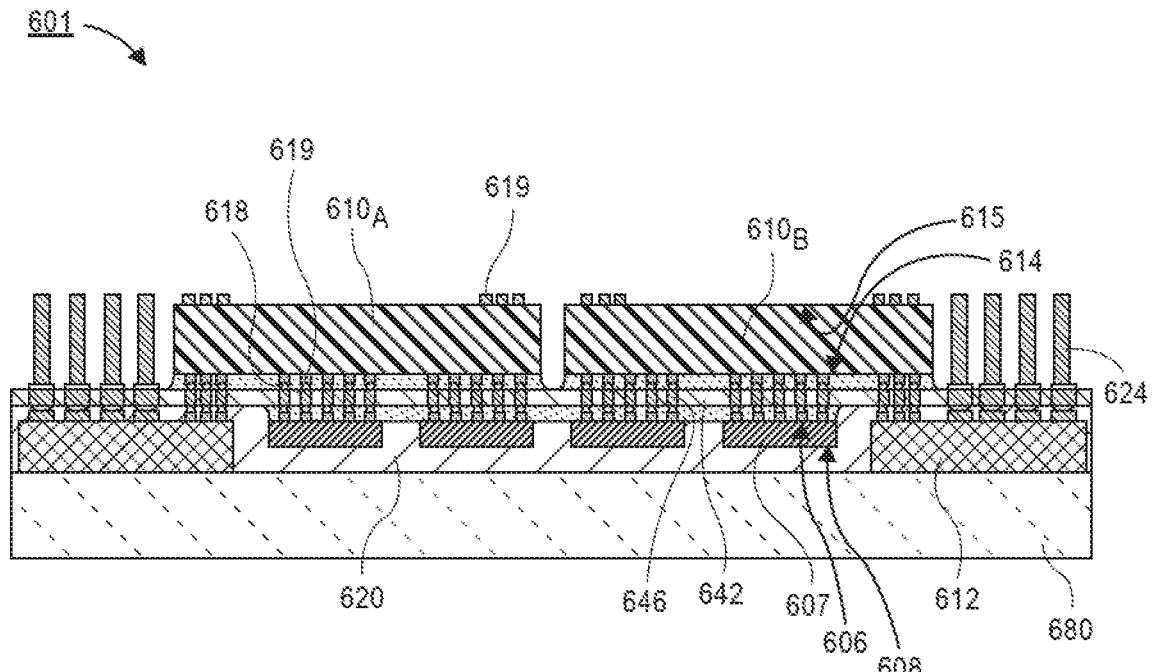
FIG. 6A is a cross-sectional illustration of a package with a plurality of second dies attached to the first dies, in accordance with an embodiment.
Figure 6B:
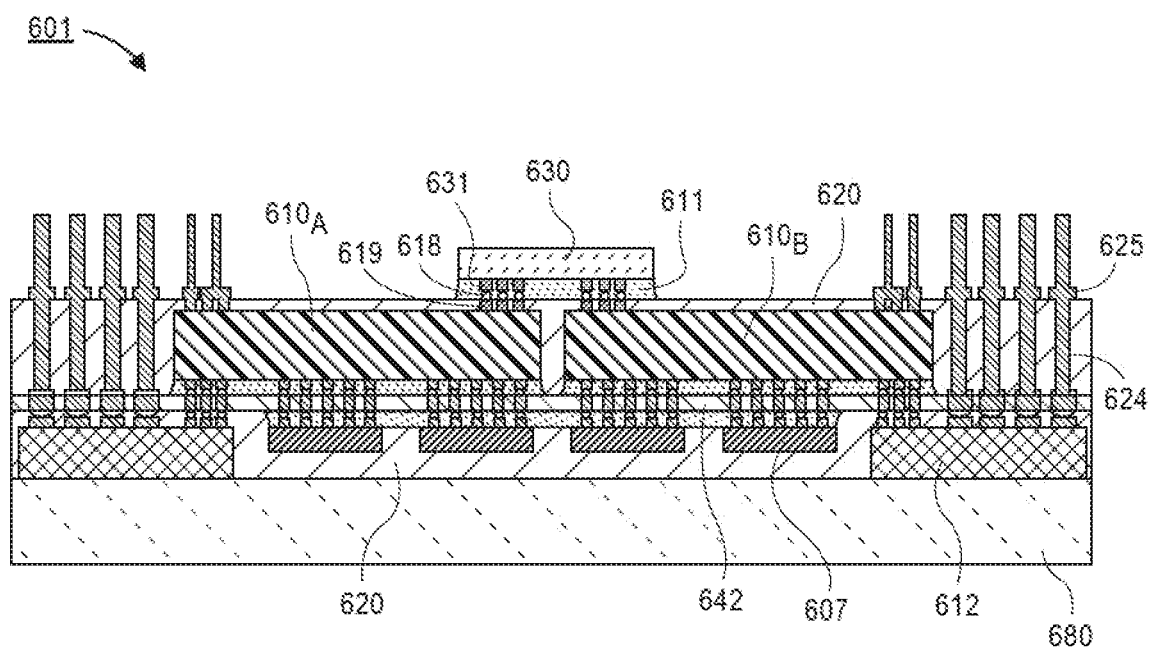
FIG. 6B is a cross-sectional illustration after a bridge is attached across the second dies, in accordance with an embodiment.
Figure 6C:
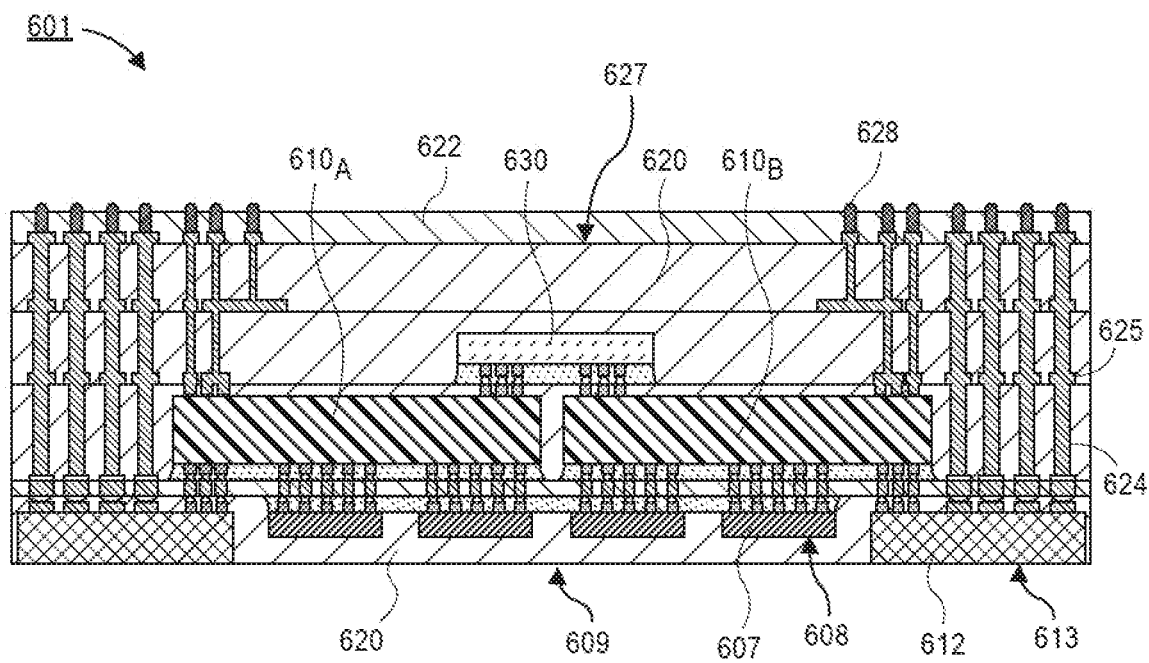
FIG. 6C is a cross-sectional illustration after RDLs are formed over the second dies and the second carrier is removed, in accordance with an embodiment.

Referring now to FIGS. 6A-6C, a series of cross-sectional illustrations depicting a process for forming an electronic package 601 similar to the electronic package 201 described with respect to FIG. 2B is shown, in accordance with an embodiment.

Referring now to FIG. 6A, a cross-sectional illustration of an electronic package 601 after a plurality of second dies 610 are coupled to first dies 607 is shown, in accordance with an embodiment. In an embodiment, the incoming electronic package 601 may be fabricated with substantially similar processing operations described with respect to FIGS. 5A-5E. For example, the backside surfaces 608 of first dies 607 and backside surfaces 613 of HSIO dies 612 may be facing a second carrier 680, and vias 624 may be formed over the HSIO dies 612. Additionally, a solder resist 642 with vias 646 may be positioned over the first dies 607 and the HSIO dies 612.

In an embodiment, the second dies 610A and 610E may be attached to the first dies 607 with a TCB tool. Since the TCB attach happens in the early stages of package assembly (and with the dimensionally stable second carrier 680 still in place) the impact of warpage is minimal. Accordingly, yield loss is minimal or none.

In an embodiment, the second dies 610A and 610E may be coupled to the first dies 607 and the HSIO dies 612 with FLIs 618. For example, FLIs 618 may couple pads 619 of the second dies 610 to the vias 646 through the solder resist 642. In an embodiment, an underfill material 611 may surround the FLIs 618 and the pads 619 of the second die 610.

In an embodiment, the second dies 610 may be mounted to the first dies 607 in a face-to-face configuration. That is, an active surface 614 of the second dies 610 may face the active surface 606 of the first dies 607. In an embodiment, pads 619 may also be formed over backside surfaces 615 of the second dies 610. The pads 619 over the backside surface 619 may be pads for through substrate vias (TSVs) (not shown) that allow for electrical connections to pass through the second dies 610 from the active surface 614 to the backside surface 615. In an embodiment, the first dies 607 may be fabricated at a first process node and the second dies 610 may be fabricated at a second process node that is less advanced than the first process node.

Referring now to FIG. 6B, a cross-sectional illustration of the electronic package 601 after a mold layer 620 surrounds the second dies 610 and a bridge 630 is attached across the second dies 610A and 610E is shown, in accordance with an embodiment. In an embodiment, the bridge 630 may be an EMIB or the like that provides electrical coupling between second dies 610A and 610B. The interconnection of an array of second dies 610 with one or more bridges 630 provides a die tiling architecture. That is, the plurality of second dies 610 may function as a single die. This may be particularly beneficial when the combined area of the second dies 610 exceeds the reticle limit of the process node used to fabricate the second dies 610.

In an embodiment, the bridge 630 may comprise pads 631 that are electrically coupled to pads 619 on the backside surface 615 of the second dies 610. In an embodiment the pads 619 may be electrically coupled to pads 631 with FLIs 618. The pads 631 and the FLIs 618 may be surrounded by an underfill material 611. While a single bridge 630 is shown in FIG. 6B, it is to be appreciated that electronic package 601 may comprise a plurality of bridges 630 to provide connections between any number of second dies 610.

Referring now to FIG. 6C, a cross-sectional illustration after RDLs comprising pads 625 and vias 624 are formed and the second carrier 680 is removed is shown, in accordance with an embodiment. In an embodiment, the RDLs are fabricated with a lithographic via process or a SAP process, as is known in the art. As shown in FIG. 6C, the mold layer 620 includes a plurality of distinguishable layers. However, it is to be appreciated that in some embodiments there may be no discernable boundary between layers of the mold layer 620.

In an embodiment a solder resist layer 622 is disposed over a surface 627 of the mold layer 620. In an embodiment, the resist layer is patterned and MLIs 628 may be disposed. In an embodiment, the MLIs 628 may comprise a solder or the like. Furthermore, it is to be appreciated that the MLI formation is implemented while the dimensionally stable second carrier 680 is still attached to the electronic package 601. Accordingly, the attachment of an additional carrier is not needed, as is the case with previously disclosed approaches.

In an embodiment the second carrier 680 is removed to expose a surface 609 of the mold layer 620. As shown in FIG. 6C, backside surfaces 608 of the first dies 607 are embedded in the mold layer 620. The backside surface 613 of the HSIO dies 612 are exposed in some embodiments. However, in other embodiments, the backside surface 613 of the HSIO dies 612 may also be embedded in the mold layer 620.

Figure 7:
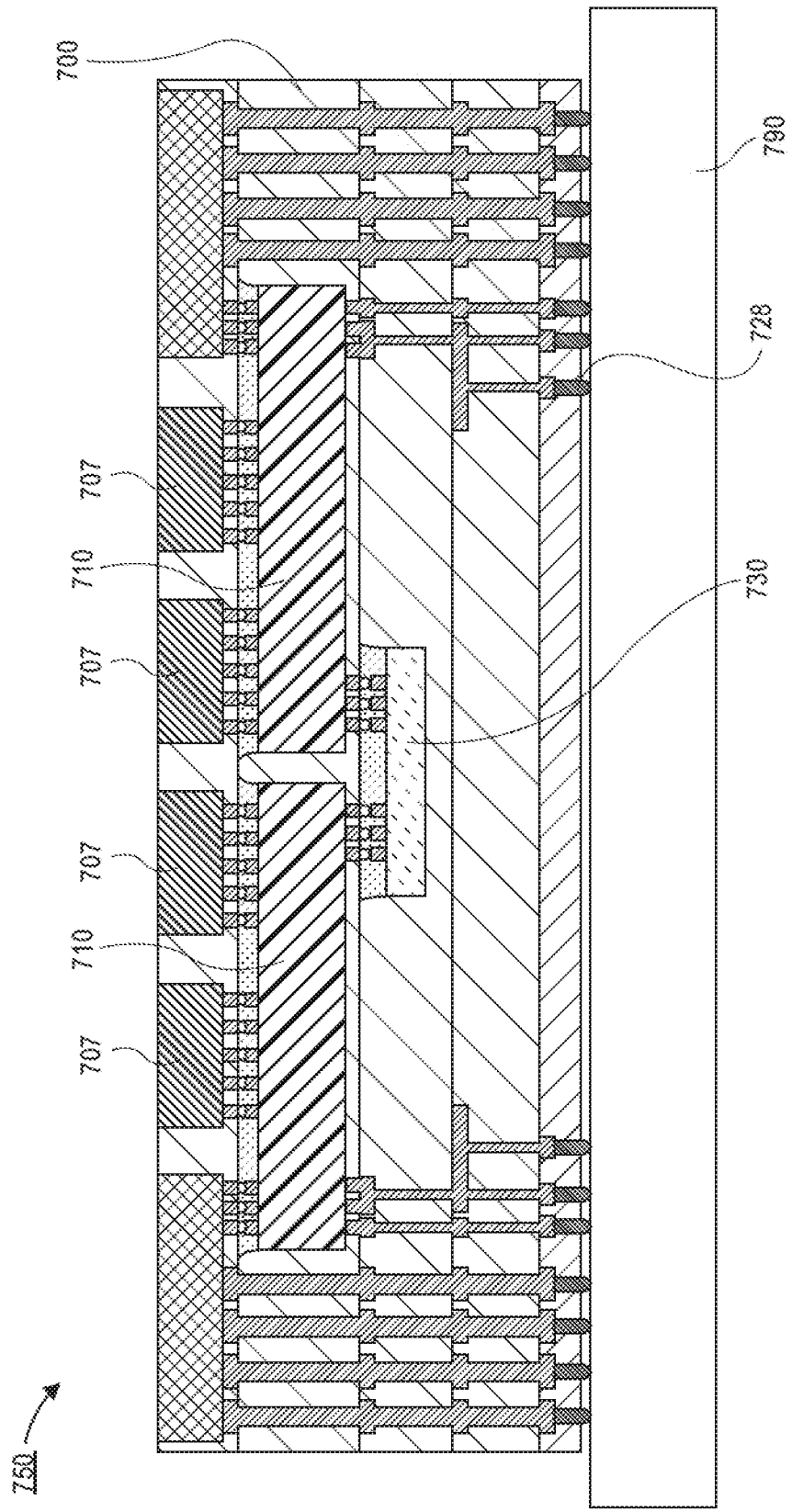
FIG. 7 is a cross-sectional illustration of an electronic system that comprises a multi-chip package, in accordance with an embodiment.

Referring now to FIG. 7, a cross-sectional illustration of an electronic system 750 is shown, in accordance with an embodiment. In an embodiment, the electronic system 750 may comprise an electronic package 700 that comprises a plurality of dies. For example, the plurality of dies may comprise first dies 707 and second dies 710. In an embodiment, the second dies 710 may be electrically coupled together by a bridge 730, such as an EMIB. In some embodiments, the first dies 707 and the second dies 710 are oriented in a face-to-face configuration. In some embodiments, the first dies 707 have are fabricated at a first process node and the second dies 710 are fabricated at a second process node that is less advanced than the first process node. In an embodiment, the electronic package 700 may be any electronic package such as those disclosed in greater detail above.

In an embodiment, the electronic package 700 may be electrically coupled to a board 790. For example, MLIs 728 of the electronic package 700 may be electrically and mechanically coupled to pads (not shown) on the board 790. While the MLIs 728 are illustrated as solder bumps, it is to be appreciated that the electronic package 700 may be connected to the board 790 with any suitable interconnect architecture. The board 790 may be any suitable board, such as a printed circuit board (PCB) or the like.

Figure 8:
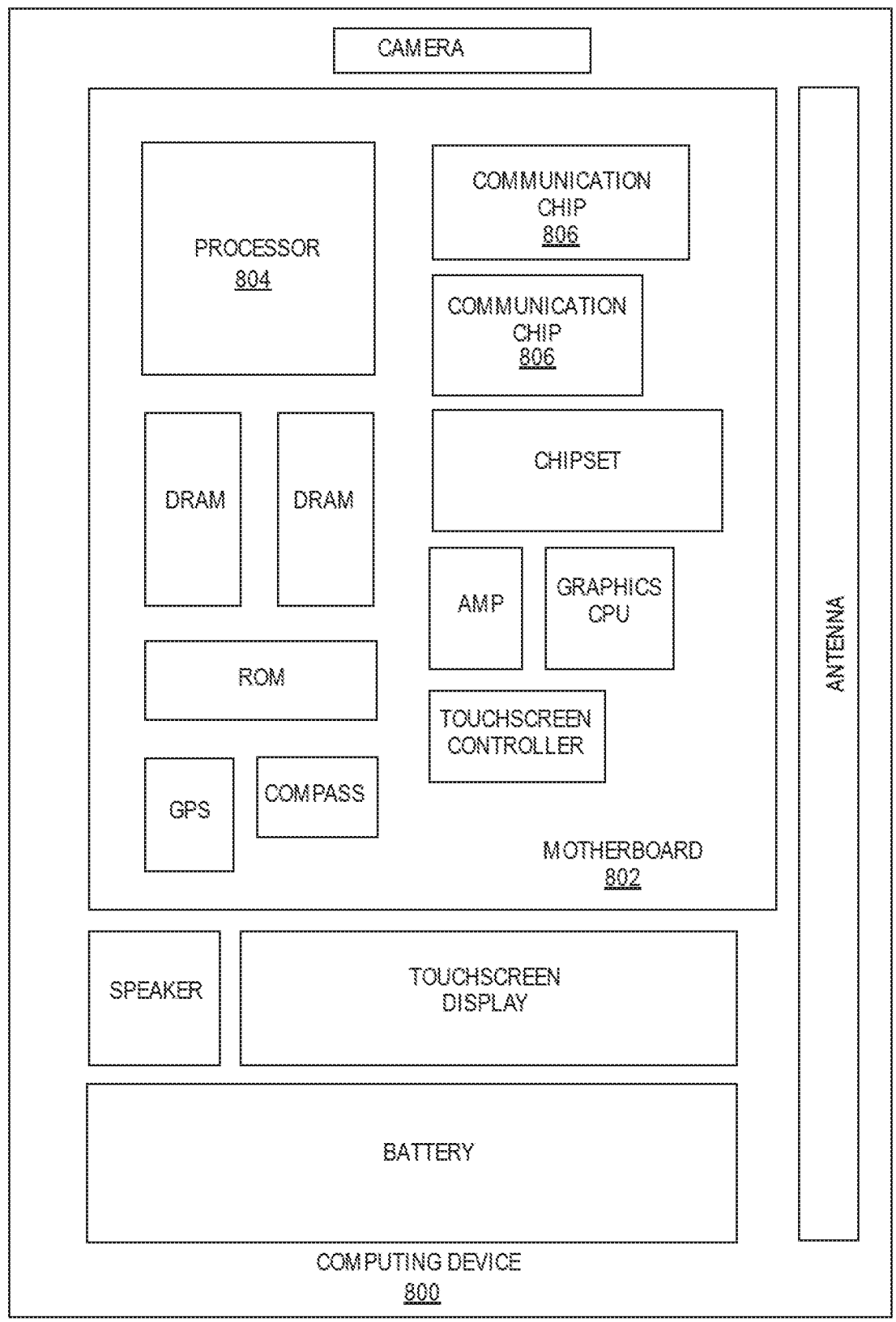
FIG. 8 is a schematic of a computing device built in accordance with an embodiment.

FIG. 8 illustrates a computing device 800 in accordance with one implementation of the invention. The computing device 800 houses a board 802. The board 802 may include a number of components, including but not limited to a processor 804 and at least one communication chip 806. The processor 804 is physically and electrically coupled to the board 802. In some implementations the at least one communication chip 806 is also physically and electrically coupled to the board 802. In further implementations, the communication chip 806 is part of the processor 804.

These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 806 enables wireless communications for the transfer of data to and from the computing device 800. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 806 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 800 may include a plurality of communication chips 806. For instance, a first communication chip 806 may be dedicated to shorter range wireless communications such as Wi-Fi and Bluetooth and a second communication chip 806 may be dedicated to longer range wireless communications such as GPS, EDGE, GPRS, CDMA, WiMAX, LTE, Ev-DO, and others.

The processor 804 of the computing device 800 includes an integrated circuit die packaged within the processor 804. In some implementations of the invention, the integrated circuit die of the processor may be packaged in an electronic system that comprises a package substrate with first dies and second dies in a face-to-face configuration, in accordance with embodiments described herein. The term "processor"

may refer to any device or portion of a device that processes electronic data from registers and/or memory to transform that electronic data into other electronic data that may be stored in registers and/or memory.

The communication chip 806 also includes an integrated circuit die packaged within the communication chip 806. In accordance with another implementation of the invention, the integrated circuit die of the communication chip may be packaged in an electronic system that comprises a package substrate with first dies and second dies in a face-to-face configuration, in accordance with embodiments described herein.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

Example 1

An electronic package, comprising: a mold layer having a first surface and a second surface opposite the first surface; a plurality of first dies embedded in the mold layer, wherein each of the plurality of first dies has a surface that is substantially coplanar with the first surface of the mold layer; and a second die embedded in the mold layer, wherein the second die is positioned between the plurality of first dies and the second surface of the mold layer.

Example 2

The electronic package of Example 1, wherein the plurality of first dies are electrically coupled to the second die with first level interconnects (FLI).

Example 3

The electronic package of Example 1 or Example 2, wherein active surfaces of the plurality of first dies are oriented to be facing an active surface of the second die.

Example 4

The electronic package of Examples 1-3, wherein the plurality of first dies comprise dies fabricated at a first process node, and wherein the second die is fabricated at a second process node that is less advanced than the first process node.

Example 5

The electronic package of Examples 1-4, further comprising: a plurality of high speed input/out (HSIO) dies embedded in the mold layer.

Example 6

The electronic package of Examples 1-5, wherein the plurality of HSIO dies are electrically coupled to the second die.

Example 7

The electronic package of Examples 1-6, wherein each of the plurality of HSIO dies has a surface that is substantially coplanar with the first surface of the mold layer.

Example 8

The electronic package of Examples 1-7, further comprising: a plurality of second dies.

Example 9

The electronic package of Examples 1-8, wherein the plurality of second dies are electrically coupled to each other by a bridge embedded in the mold layer.

Example 10

The electronic package of Examples 1-9, wherein the plurality of second dies is positioned between the bridge and the plurality of first dies.

Example 11

The electronic package of Examples 1-10, further comprising: mid-level interconnects (MLIs) extending from the second surface of the mold layer.

Example 12

The electronic package of Examples 1-11, wherein the MLIs are electrically coupled to the plurality of first dies and the second die by conductive pillars and pads embedded in the mold layer.

Example 13

An electronic package, comprising: a mold layer having a first surface and a second surface opposite the first surface; a plurality of first dies embedded in the mold layer; a second die embedded in the mold layer, wherein the second die is positioned between the plurality of first dies and the second surface of the mold layer; and a solder resist layer between the plurality of first dies and the second die.

Example 14

The electronic package of Example 13, wherein each of the plurality of first dies is entirely embedded in the mold layer.

Example 15

The electronic package of Example 13 or Example 14, further comprising: a plurality of high speed input/out (HSIO) dies electrically coupled to the second die.

Example 16

The electronic package of Examples 13-15, wherein the plurality of HSIO dies have a first thickness and the plurality of first dies have a second thickness that is different than the first thickness.

Example 17

The electronic package of Examples 13-16, wherein the plurality of first dies are fabricated at a first process node, and wherein the second die is fabricated at a second process node that is less advanced than the first process node.

Example 18

The electronic package of Examples 13-17, further comprising: a plurality of second dies, wherein each of the second dies are electrically coupled to each other by one or more bridges embedded in the mold layer.

Example 19

A method of fabricating an electronic package, comprising: placing a plurality of first dies on a carrier; disposing a first mold layer over the plurality of first dies, wherein contact pads of the first dies are exposed; attaching a second die to the plurality of first dies with first level interconnects (FLIs); and disposing a second mold layer over the second die.

Example 20

The method of Example 19, wherein the first dies are placed on the carrier with a die mounter, and wherein the second die is attached to the plurality of first dies with a thermal compression bonding (TCB) tool.

Example 21

The method of Example 19 or Example 20, further comprising: fabricating a redistribution layer above the second die; disposing a solder resist over the redistribution layer; forming openings in the solder resist; disposing mid-level interconnects (MLIs) in the openings; and removing the carrier.

Example 22

An electronic system, comprising: a board; a multi-die package coupled to the board, wherein the multi-die package comprises: a mold layer having a first surface and a second surface; a plurality of first dies, wherein the plurality of first dies are embedded in the mold layer; and a second die coupled to the plurality of first dies, wherein active surfaces of the first dies face an active surface of the second die, wherein the second die is embedded in the mold layer, and wherein the second die is between the active surface of the first dies and the second surface of the mold layer.

Example 23

The electronic system of Example 22, wherein the plurality of first dies are first process node dies, and wherein the second die is a second process node die, wherein the first process node is more advanced than the second process node.

Example 24

The electronic system of Example 23, further comprising: a plurality of high speed input/out (HSIO) dies embedded in the mold layer.

Example 25

The electronic system of Example 23 or Example 24, wherein the plurality of HSIO dies are electrically coupled to the second die.

What is claimed is:

1. An electronic package, comprising:
   a first mold layer having a first surface and a second surface opposite the first surface;
   a plurality of first dies embedded in the first mold layer, wherein each of the plurality of first dies has a surface that is substantially coplanar with the first surface of the first mold layer;
   a second die embedded in a second mold layer, wherein the second die is positioned vertically over the plurality of first dies, wherein the second mold layer is not vertically between the second die and the plurality of first dies;
   a first plurality of vias in the second mold layer, the first plurality of vias laterally spaced apart from a first side of the second die, wherein the first plurality of vias extend along an entire vertical length of the second die; and
   a second plurality of vias in the second mold layer, the second plurality of vias laterally spaced apart from a second side of the second die, the second side opposite the first side, wherein the second plurality of vias extend along an entire vertical length of the second die.

2. The electronic package of claim 1, wherein the plurality of first dies are electrically coupled to the second die with first level interconnects (FLI).

3. The electronic package of claim 2, wherein active surfaces of the plurality of first dies are oriented to be facing an active surface of the second die.

4. The electronic package of claim 1, wherein the plurality of first dies comprise dies fabricated at a first process node, and wherein the second die is fabricated at a second process node that is less advanced than the first process node.

5. The electronic package of claim 1, further comprising:
   a plurality of high speed input/out (HSIO) dies embedded in the first mold layer.

6. The electronic package of claim 5, wherein the plurality of HSIO dies are electrically coupled to the second die.

7. The electronic package of claim 5, wherein each of the plurality of HSIO dies has a surface that is substantially coplanar with the first surface of the first mold layer.

8. The electronic package of claim 1, further comprising:
   a plurality of second dies.

9. The electronic package of claim 8, wherein the plurality of second dies are electrically coupled to each other by a bridge embedded in a third mold layer.

10. The electronic package of claim 9, wherein the plurality of second dies is positioned between the bridge and the plurality of first dies.

11. The electronic package of claim 1, further comprising:
    mid-level interconnects (MLIs).

12. The electronic package of claim 11, wherein the MLIs are electrically coupled to the plurality of first dies and the second die by conductive pillars and pads.

13. An electronic package, comprising:
a first mold layer having a first surface and a second surface opposite the first surface;
a plurality of first dies embedded in the first mold layer;
a second die embedded in a second mold layer, wherein the second die is positioned vertically over the plurality of first dies, wherein the first mold layer is not vertically between the second die and the plurality of first dies;
a solder resist layer between the plurality of first dies and the second die;
a first plurality of vias in the second mold layer, the first plurality of vias laterally spaced apart from a first side of the second die; and
a second plurality of vias in the second mold layer, the second plurality of vias laterally spaced apart from a second side of the second die, the second side opposite the first side.

14. The electronic package of claim 13, wherein each of the plurality of first dies is entirely embedded in the first mold layer.

15. The electronic package of claim 13, further comprising:
a plurality of high speed input/out (HSIO) dies electrically coupled to the second die.

16. The electronic package of claim 15, wherein the plurality of HSIO dies have a first thickness and the plurality of first dies have a second thickness that is different than the first thickness.

17. The electronic package of claim 13, wherein the plurality of first dies are fabricated at a first process node, and wherein the second die is fabricated at a second process node that is less advanced than the first process node.

18. The electronic package of claim 13, further comprising:
a plurality of second dies, wherein each of the second dies are electrically coupled to each other by one or more bridges embedded in a third mold layer.

19. A method of fabricating an electronic package, comprising:
placing a plurality of first dies on a carrier;
disposing a first mold layer over the plurality of first dies, wherein contact pads of the first dies are exposed;
attaching a second die to the plurality of first dies with first level interconnects (FLIs);
disposing a second mold layer over the second die, wherein the second mold layer is not vertically between the second die and the plurality of first dies;
forming a first plurality of vias in the second mold layer, the first plurality of vias laterally spaced apart from a first side of the second die, wherein the first plurality of vias extend along an entire vertical length of the second die; and
forming a second plurality of vias in the second mold layer, the second plurality of vias laterally spaced apart from a second side of the second die, the second side opposite the first side, wherein the second plurality of vias extend along an entire vertical length of the second die.

20. The method of claim 19, wherein the first dies are placed on the carrier with a die mounter, and wherein the second die is attached to the plurality of first dies with a thermal compression bonding (TCB) tool.

21. The method of claim 19, further comprising:
fabricating a redistribution layer above the second die;
disposing a solder resist over the redistribution layer;
forming openings in the solder resist;
disposing mid-level interconnects (MLIs) in the openings; and
removing the carrier.

22. An electronic system, comprising:
a board;
a multi-die package coupled to the board, wherein the multi-die package comprises:
a first mold layer having a first surface and a second surface;
a plurality of first dies, wherein the plurality of first dies are embedded in the first mold layer; and
a second die coupled to the plurality of first dies, wherein active surfaces of the first dies face an active surface of the second die, wherein the second die is embedded in a second mold layer, wherein the second die is vertically over the active surface of the first dies, and wherein the second mold layer is not vertically between the second die and the plurality of first dies;
a first plurality of vias in the second mold layer, the first plurality of vias laterally spaced apart from a first side of the second die, wherein the first plurality of vias extend along an entire vertical length of the second die; and
a second plurality of vias in the second mold layer, the second plurality of vias laterally spaced apart from a second side of the second die, the second side opposite the first side, wherein the second plurality of vias extend along an entire vertical length of the second die.

23. The electronic system of claim 22, wherein the plurality of first dies are first process node dies, and wherein the second die is a second process node die, wherein the first process node is more advanced than the second process node.

24. The electronic system of claim 22, further comprising: a plurality of high speed input/out (HSIO) dies embedded in the first mold layer.

25. The electronic system of claim 24, wherein the plurality of HSIO dies are electrically coupled to the second die.

* * * * *